United States Patent
Yang et al.

(10) Patent No.: US 11,417,787 B2
(45) Date of Patent: Aug. 16, 2022

(54) SOLAR CELL MODULE AND METHOD FOR MANUFACTURING THE SAME

(71) Applicant: LG ELECTRONICS INC., Seoul (KR)

(72) Inventors: Hyeyoung Yang, Seoul (KR); Chunghyun Lim, Seoul (KR); Taehee Shin, Seoul (KR); Bojoong Kim, Seoul (KR); Taeki Woo, Seoul (KR); Ayoung Bak, Seoul (KR); Daesung Son, Seoul (KR); Junhan Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 12 days.

(21) Appl. No.: 15/259,874

(22) Filed: Sep. 8, 2016

(65) Prior Publication Data
US 2017/0069776 A1 Mar. 9, 2017

(30) Foreign Application Priority Data

Sep. 8, 2015 (KR) .................. 10-2015-0126854
Jul. 22, 2016 (KR) .................. 10-2016-0093192

(51) Int. Cl.
*H01L 31/044* (2014.01)
*H01L 31/05* (2014.01)
(Continued)

(52) U.S. Cl.
CPC .. *H01L 31/0508* (2013.01); *H01L 31/022433* (2013.01); *H01L 31/0512* (2013.01);
(Continued)

(58) Field of Classification Search
CPC .... H01L 31/05–0516; H01L 31/022433; H01I 31/0508; H01I 31/022433; H01I 31/0512; H01I 31/0516
See application file for complete search history.

(56) References Cited

U.S. PATENT DOCUMENTS 6,204,558 B1 * 3/2001 Yanagida .......... H01L 24/11
257/737
2001/0050181 A1 * 12/2001 Miura .............. H05K 3/3436
174/256
(Continued)

FOREIGN PATENT DOCUMENTS

EP 2869350 A1 5/2015
EP 2911206 A2 8/2015
(Continued)

OTHER PUBLICATIONS

Mei et al. "Low-Temperature Solders." Aug. 1996 Hewlett-Packard Journal. pp. 1-10.*

(Continued)

*Primary Examiner* — Bach T Dinh
(74) *Attorney, Agent, or Firm* — Birch, Stewart, Kolasch & Birch, LLP

(57) ABSTRACT

A solar cell module and a method for manufacturing the same are discussed. The solar cell module includes a plurality of solar cells each including a semiconductor substrate and first and second electrodes, each of which has a different polarity and is extended in a first direction on a back surface of the semiconductor substrate, and a plurality of conductive lines extended in a second direction crossing the first direction on the back surface of the semiconductor substrate, connected to one of the first and second electrodes through a conductive adhesive, and insulated from the other electrode by an insulating layer. The conductive adhesive includes a first adhesive layer connected to the one electrode and a second adhesive layer positioned on the first adhesive layer and connected to the plurality of conductive lines.

24 Claims, 26 Drawing Sheets

(51) Int. Cl.
*H01L 31/0224* (2006.01)
*H01L 31/18* (2006.01)

(52) U.S. Cl.
CPC .......... *H01L 31/0516* (2013.01); *H01L 31/18* (2013.01); *Y02E 10/50* (2013.01)

(56) References Cited

U.S. PATENT DOCUMENTS

| | | | |
|---|---|---|---|
| 2003/0178476 A1* | 9/2003 | Kanai | B23K 35/0244 228/248.1 |
| 2006/0033214 A1* | 2/2006 | Tomono | H01L 21/563 257/772 |
| 2008/0023069 A1* | 1/2008 | Terada | H01L 31/02167 136/256 |
| 2008/0216887 A1 | 9/2008 | Hacke et al. | |
| 2009/0044966 A1* | 2/2009 | Tazawa | B23K 35/26 174/117 F |
| 2012/0055531 A1 | 3/2012 | Ryu et al. | |
| 2012/0103415 A1* | 5/2012 | Sainoo | H01L 31/0516 136/256 |
| 2012/0125396 A1* | 5/2012 | Taira | H01L 31/022433 136/244 |
| 2012/0167940 A1* | 7/2012 | Toya | H01L 31/022441 136/244 |
| 2014/0285989 A1* | 9/2014 | Kubota | H01L 24/27 361/767 |
| 2014/0352773 A1* | 12/2014 | Chuang | H01L 31/022433 136/256 |
| 2014/0366928 A1* | 12/2014 | Niinobe | H01L 31/0516 136/246 |
| 2015/0207003 A1* | 7/2015 | Woo | H01L 31/056 136/246 |
| 2015/0243818 A1* | 8/2015 | Kim | H01L 31/022441 136/244 |

FOREIGN PATENT DOCUMENTS

| | | |
|---|---|---|
| JP | 7/211720 A | 8/1995 |
| JP | 11-54656 A | 2/1999 |
| JP | 2005-268466 A | 9/2005 |
| JP | 2008218629 * | 9/2008 |
| JP | 2014-192481 A | 10/2014 |
| JP | 2015-88755 A | 5/2015 |
| JP | 2015-159286 A | 9/2015 |
| JP | 2016-21577 A | 2/2016 |
| KR | 10-1542002 B1 | 7/2015 |
| KR | 10-2015-0100145 A | 9/2015 |
| KR | 10-2015-0145148 A | 12/2015 |

OTHER PUBLICATIONS

JP2008218629 English translation (Year: 2008).*
Choe et al., "Fluxless Sn—Bi—Au Bonding Process Using Multilayer Design," 2001 Electronic Components and Technology Conference, IEEE, 3 pages.

* cited by examiner (a)

(b)

SOLAR CELL MODULE AND METHOD FOR MANUFACTURING THE SAME

CROSS-REFERENCE TO RELATED APPLICATION

This application claims priority to and the benefit of Korean Patent Application No. 10-2015-0126854 filed in the Korean Intellectual Property Office on Sep. 8, 2015 and Application No. 10-2016-0093192 filed in the Korean Intellectual Property Office on Jul. 22, 2016, the entire contents of which are incorporated herein by reference.

BACKGROUND OF THE INVENTION

Field of the Invention

Embodiments of the invention relate to a solar cell module and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration may be connected to one another through interconnectors to form a module.

In a back contact solar cell, in which all of electrodes are connected to a back surface of the solar cell, a metal line may be connected to the electrode on a back surface of a semiconductor substrate.

However, when the metal line is connected to the back surface of the solar cell, the metal line and the electrode on the back surface of the semiconductor substrate are not smoothly connected and are disconnected from each other by a difference in a thermal expansion coefficient between the metal line and the semiconductor substrate.

The disconnection is more frequently generated at both ends of the metal line in a longitudinal direction of the metal line.

SUMMARY OF THE INVENTION

In one aspect, there is provided a solar cell module including a plurality of solar cells each including a semiconductor substrate and first and second electrodes, each of which has a different polarity and is extended in a first direction on a back surface of the semiconductor substrate, and a plurality of conductive lines extended in a second direction crossing the first direction on the back surface of the semiconductor substrate, connected to one of the first and second electrodes through a conductive adhesive, and insulated from the other electrode by an insulating layer, wherein the conductive adhesive includes a first adhesive layer connected to the one electrode and a second adhesive layer positioned on the first adhesive layer and connected to the plurality of conductive lines.

A melting point of the first adhesive layer may be different from a melting point of the second adhesive layer. For example, the melting point of the second adhesive layer may be lower than the melting point of the first adhesive layer.

A thickness of the second adhesive layer between the first adhesive layer and one conductive line may be less than a thickness of the first adhesive layer.

The first adhesive layer may be made of a solder paste including at least one material of Sn, SnAgCu, SnPb, SnBiCuCo, SnBiAg, SnPbAg, and SnAg. The second adhesive layer may be made of a solder paste including at least one material of SnBi and SnIn.

The plurality of conductive lines may include first conductive lines connected to the first electrodes and second conductive lines connected to the second electrodes. The first adhesive layer may be positioned at each of a plurality of crossings between the first conductive lines and the first electrodes and at each of a plurality of crossings between the second conductive lines and the second electrodes and may be spaced apart from one another.

The second adhesive layer may be positioned on each first adhesive layer.

At least a portion of the second adhesive layer may be formed in a long pattern, in which a second direction length of the second adhesive layer is longer than a second direction length of the first adhesive layer.

More specifically, the back surface of the semiconductor substrate included in each solar cell may include a middle portion and edge portions positioned at both edges of the middle portion in the second direction. The long pattern of the second adhesive layer may be positioned in the edge portions, or the second adhesive layer may be formed in the long pattern on the entire back surface of the semiconductor substrate.

In the edge portions of the semiconductor substrate, a second direction length or a location of the long pattern overlapping the first conductive line may be different from a second direction length or a location of the long pattern overlapping the second conductive line.

The second adhesive layer of the long pattern may overlap the first adhesive layer and the insulating layer.

In the edge portions of the semiconductor substrate, a second direction length of the second adhesive layer having the long pattern may be greater than a distance between both ends of two crossings, that are adjacent to each other in the second direction, and may be within 10% of a maximum second direction length of the semiconductor substrate.

The edge portions of the semiconductor substrate may include a first edge portion adjacent to a first side of the semiconductor substrate, to which the first conductive line protrudes, and a second edge portion positioned opposite the first side and adjacent to a second side of the semiconductor substrate, to which the second conductive line protrudes.

In the first edge portion of the semiconductor substrate, the second direction length of the long pattern overlapping the first conductive line may be longer than the second direction length of the long pattern overlapping the second conductive line.

The second direction length of the long pattern overlapping the first conductive line in the first edge portion may be longer than the second direction length of the long pattern overlapping the first conductive line in the second edge portion.

In the second edge portion of the semiconductor substrate, the second direction length of the long pattern overlapping the second conductive line may be longer than the second direction length of the long pattern overlapping the first conductive line.

The second direction length of the long pattern overlapping the second conductive line in the second edge portion may be longer than the second direction length of the long pattern overlapping the second conductive line in the first edge portion.

The first electrodes in both the edge portions of the semiconductor substrate may include a plurality of first finger electrodes, that are extended in the first direction and are disconnected in a portion in which the second conductive is positioned, and a first connection electrode, that is positioned inside an overlap portion between the first conductive line and the first finger electrodes and connects the plurality of first finger electrodes in the second direction. The second electrodes in both the edge portions of the semiconductor substrate may include a plurality of second finger electrodes, that are extended in the first direction and are disconnected in a portion in which the first conductive is positioned, and a second connection electrode, that is positioned inside an overlap portion between the second conductive line and the second finger electrodes and connects the plurality of second finger electrodes in the second direction.

Each of the first and second connection electrodes may be formed in a zigzag shape in both the edge portions of the semiconductor substrate.

The first electrodes in both the edge portions of the semiconductor substrate may further include a first branch electrode protruding from the first finger electrode in the second direction in the overlap portion between the first conductive line and the first finger electrodes. The second electrodes in both the edge portions of the semiconductor substrate may further include a second branch electrode protruding from the second finger electrode in the second direction in the overlap portion between the second conductive line and the second finger electrodes.

The solar cell module may further include an interconnector disposed between first and second solar cells, that are adjacent to each other among the plurality of solar cells, and extended in the first direction. The first conductive lines connected to the first solar cell and the second conductive lines connected to the second solar cell may be commonly connected to the interconnector, and the first and second solar cells may be connected in series to each other in the second direction by the interconnector.

In another aspect, there is provided a method for manufacturing a solar cell module including preparing a plurality of solar cells each including first and second electrodes, each of which has a different polarity and is extended on a back surface of a semiconductor substrate in a first direction, forming a first adhesive layer on one of the first and second electrodes and forming an insulating layer on the other electrode, applying a second adhesive layer, of which a melting point is lower than a melting point of the first adhesive layer, to the first adhesive layer, disposing a conductive line in a second direction crossing the first direction so that the conductive line overlaps the first and second adhesive layers and the insulating layer, and performing a lamination process involving heat and pressure in a state where the plurality of solar cells are disposed between a front transparent substrate and a back sheet, to attach the second adhesive layer to the conductive line.

A temperature of the lamination process may be higher than the melting point of the second adhesive layer and may be lower than the melting point of the first adhesive layer.

The applying of the second adhesive layer may include forming the second adhesive layer in a long pattern, in which a second direction length of at least a portion of the second adhesive layer positioned in an edge portion of the semiconductor substrate is longer than a second direction length of the first adhesive layer.

In the edge portion of the semiconductor substrate, a second direction length or a location of the long pattern overlapping a first conductive line included in the conductive line may be different from a second direction length or a location of the long pattern overlapping a second conductive line included in the conductive line.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
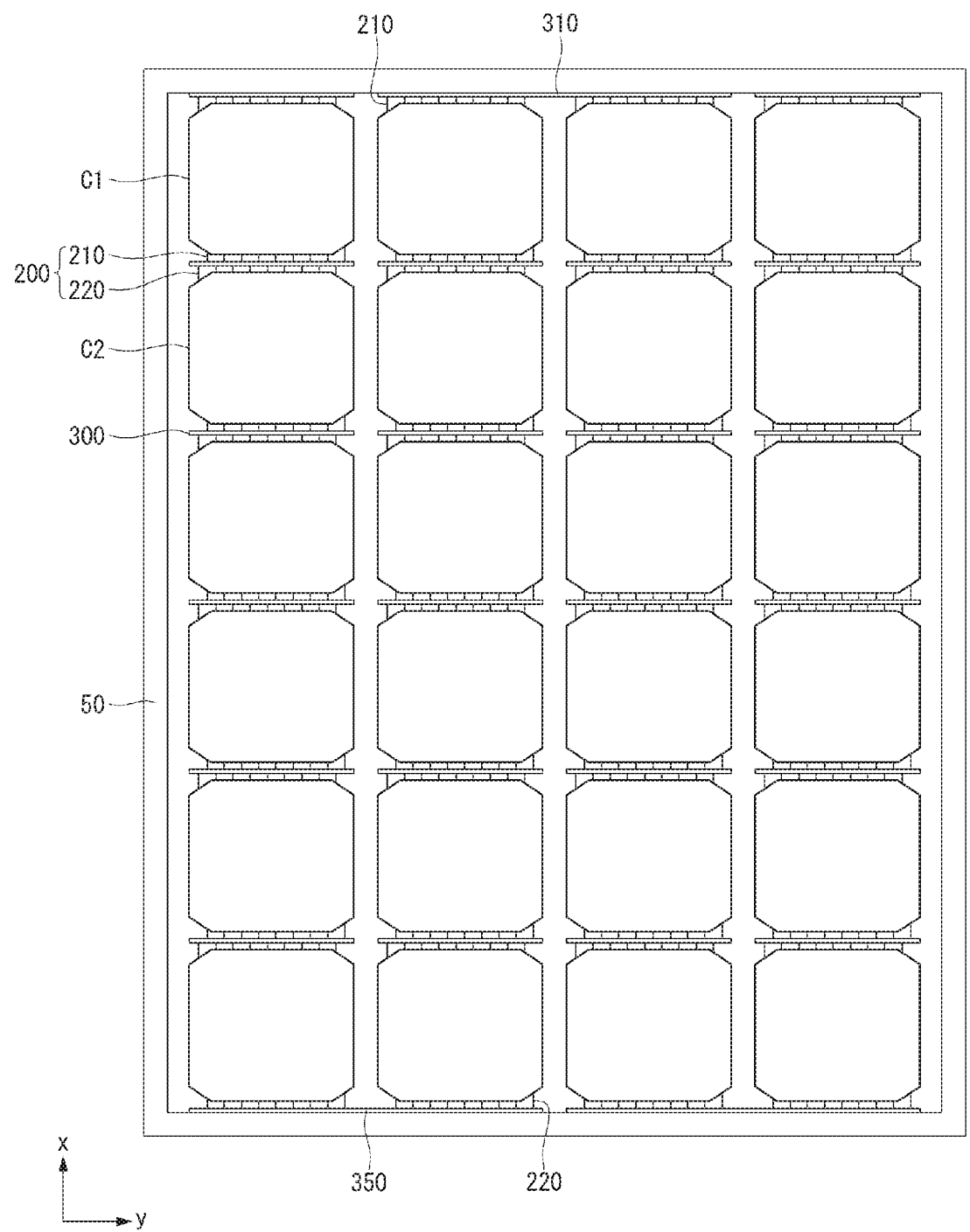
FIG. 1 is a plane view illustrating an entire front surface of a solar cell module according to an embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

In the following description, a cell string indicates a structure or a shape, in which a plurality of solar cells are connected in series to one another.

In the following description, the fact that a thickness or a width of a component is equal to a thickness or a width of another component indicates that they have the same value within a margin of error of 10% including a process error.

Figure 2:
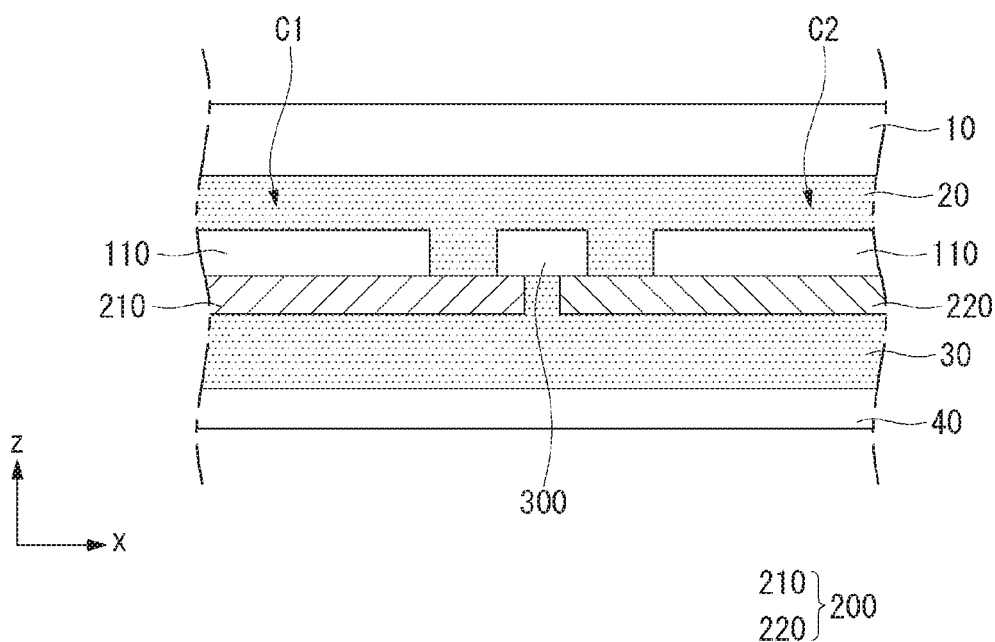
FIG. 2 is a cross-sectional view schematically illustrating first and second solar cells, that are adjacent to each other in a second direction and are connected by an interconnector.

FIG. 1 is a plane view illustrating an entire front surface of a solar cell module according to an embodiment of the invention. FIG. 2 is a cross-sectional view schematically illustrating first and second solar cells, that are adjacent to each other in a second direction and are connected by an interconnector.

As shown in FIGS. 1 and 2, a solar cell module according to an embodiment of the invention may include a plurality of solar cells and a plurality of first and second conductive lines 200.

In addition, the solar cell module according to the embodiment of the invention may further include an interconnector 300 for connecting in series the plurality of solar cells in a second direction x and a front transparent substrate 10, encapsulants 20 and 30, a back sheet 40, and a frame 50 for encapsulating a cell string formed by connecting the plurality of solar cells in series.

As shown in FIG. 1, each solar cell may be arranged to extend in the second direction x and may include a semiconductor substrate 110 and a plurality of first and second electrodes 141 and 142 on a back surface of the semiconductor substrate 110.

As shown in FIGS. 1 and 2, a plurality of first and second conductive lines 200 may be connected to a back surface of each solar cell.

As shown in FIGS. 1 and 2, the plurality of solar cells, to which the plurality of first and second conductive lines 200 are connected, may be connected in series to each other in the second direction x by the interconnector 300.

For example, the interconnector 300 may connect in series first and second solar cells C1 and C2, that are positioned adjacent to each other in the second direction x among the plurality of solar cells.

In this instance, as shown in FIG. 2, front surfaces of a plurality of first conductive lines 210 connected to the first solar cell C1 and front surfaces of a plurality of second conductive lines 220 connected to the second solar cell C2 may be connected to a back surface of the interconnector 300. Hence, the plurality of solar cells C1 and C2 may be connected in series to form a cell string.

As shown in FIG. 2, the cell string, that is disposed between the front transparent substrate 10 and the back sheet 40, may be thermally pressed and laminated.

For example, a lamination process simultaneously applying heat and pressure may be performed in a state where the plurality of solar cells C1 and C2 are disposed between the front transparent substrate 10 and the back sheet 40, and the encapsulants 20 and 30 of a transparent material (for example, an ethylene vinyl acetate (EVA) sheet) are disposed on the front surfaces and the back surfaces of the plurality of solar cells C1 and C2. Hence, the components may be integrated and encapsulated.

As shown in FIG. 1, edges of the front transparent substrate 10, the encapsulants 20 and 30, and the back sheet 40, that are encapsulated through the lamination process, may be fixed and protected by the frame 50.

Each cell string may extend in the second direction x. The plurality of cell strings may be spaced apart from one another in a first direction y and may be connected in series to one another in the first direction y by a bushing bar 310 extending in the first direction y.

The front transparent substrate 10 may be formed of a tempered glass, etc. having a high transmittance and an excellent damage prevention function.

The back sheet 40 can prevent moisture and oxygen from penetrating into the back surfaces of the solar cells C1 and C2 and protect the solar cells C1 and C2 from an external environment. The back sheet 40 may have a multi-layered structure including a moisture/oxygen penetrating prevention layer, a chemical corrosion prevention layer, etc.

The back sheet 40 may be formed as a thin sheet formed of an insulating material, such as fluoropolymer/polyester/fluoropolymer (FP/PE/FP). Insulating sheets formed of other insulating materials may be used in the back sheet 40.

The lamination process may be performed in a state where the sheet-shaped encapsulants 20 and 30 are respectively disposed between the front transparent substrate 10 and the solar cells C1 and C2 and between the solar cells C1 and C2 and the back sheet 40.

Figure 3:
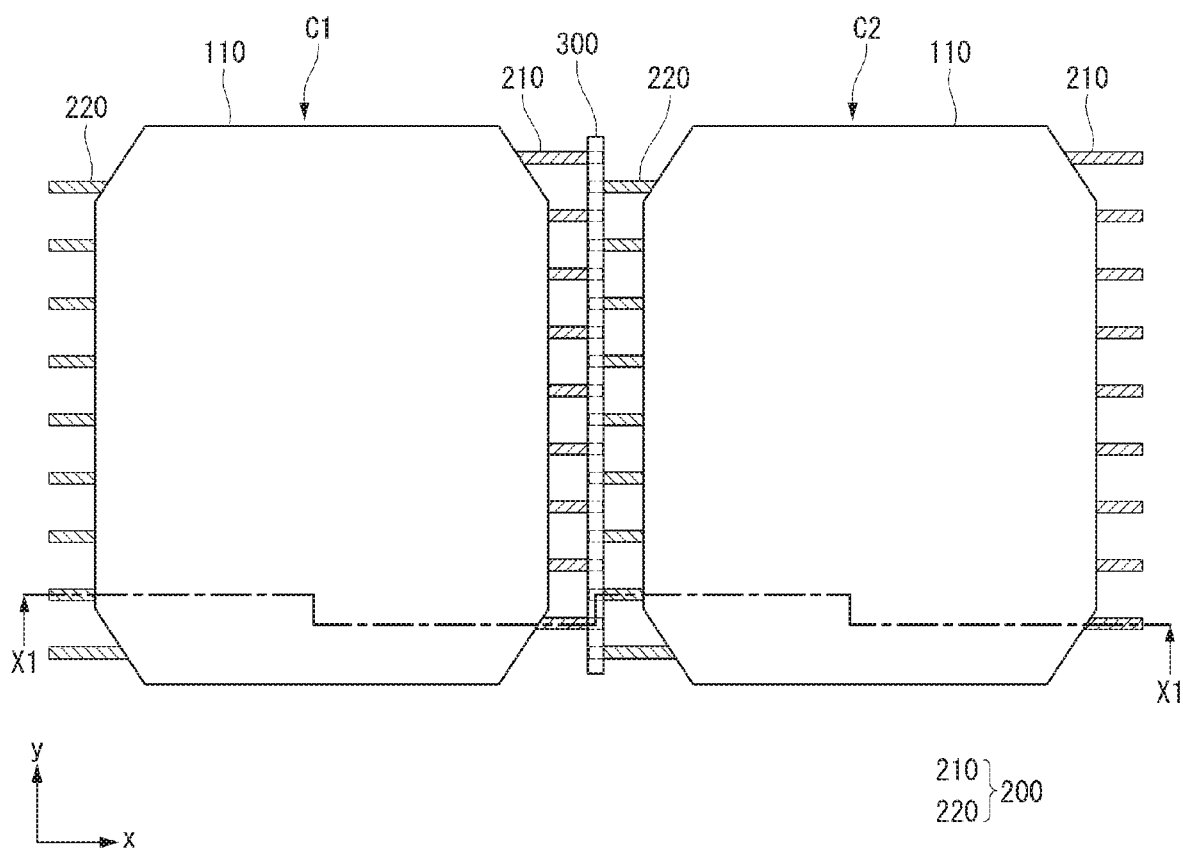
FIGS. 3 to 5 illustrate in detail a serial connection structure of first and second solar cells.

In the embodiment disclosed herein, the encapsulants 20 and 30 may be formed of a material different from a material of an insulating layer IL of FIG. 3. The encapsulants 20 and 30 may be formed of a material (for example, ethylene vinyl acetate (EVA)) capable of preventing a corrosion resulting from moisture penetration and absorbing an impact to protect the solar cells C1 and C2 from the impact.

The sheet-shaped encapsulants 20 and 30 disposed between the front transparent substrate 10 and the solar cells C1 and C2 and between the solar cells C1 and C2 and the back sheet 40 may be softened and cured by heat and pressure during the lamination process.

Hereinafter, a structure of the solar cell module shown in FIGS. 1 and 2, in which the plurality of solar cells are connected in series by the conductive lines 200 and the interconnector 300, is described in detail.

Figure 4:
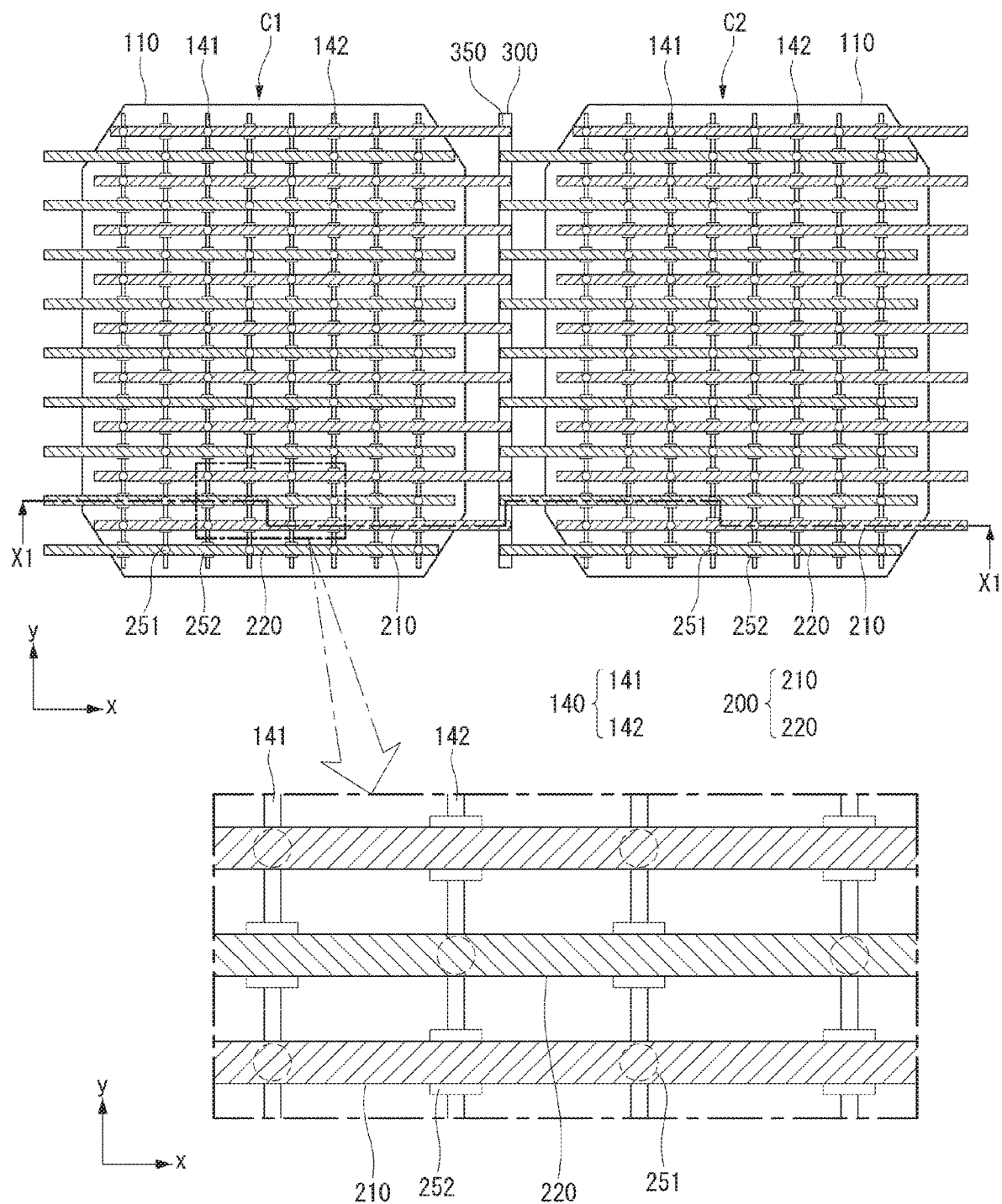
Figure 5:
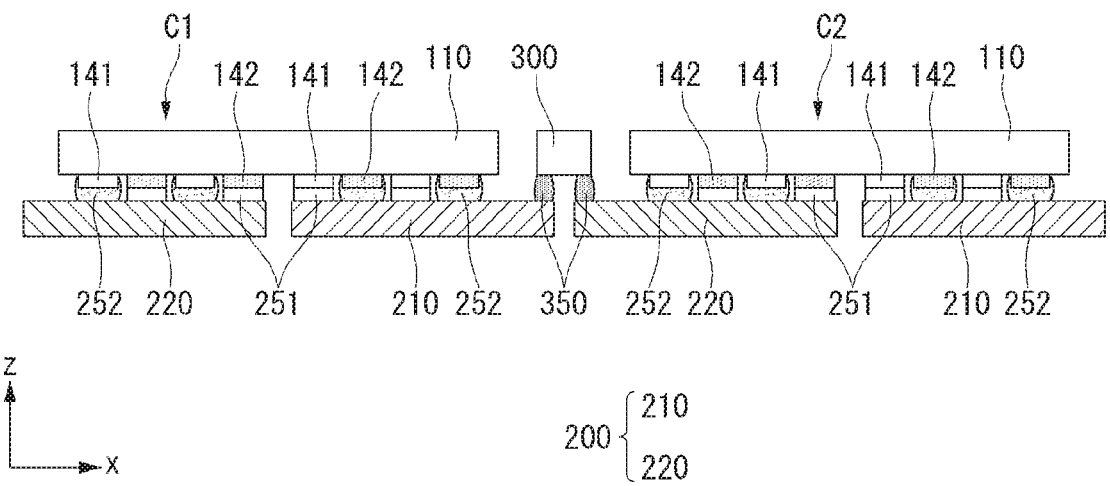

FIGS. 3 to 5 illustrate in detail a serial connection structure of first and second solar cells.

More specifically, FIG. 3 illustrates front surfaces of first and second solar cells that are adjacent to each other in the second direction and are connected by an interconnector. FIG. 4 illustrates back surfaces of first and second solar cells shown in FIG. 3. FIG. 5 is a cross-sectional view taken along line X1-X1 of FIGS. 3 and 4.

As shown in FIGS. 3 and 4, in the solar cell module according to the embodiment of the invention, a plurality of first and second conductive lines 200 may be connected to back surfaces of semiconductor substrates 110 included in first and second solar cells C1 and C2.

The first and second solar cells C1 and C2 may be arranged to be spaced apart from each other in the second direction x. As shown in FIG. 4, each of the first and second solar cells C1 and C2 may at least include the semiconductor substrate 110 and a plurality of first and second electrodes 141 and 142 that are spaced apart from each other on a back surface of the semiconductor substrate 110 and extend in the first direction y crossing the second direction x.

The plurality of first and second conductive lines 200 may be disposed to extend in an arrangement direction (i.e., the second direction x) of the first and second solar cells C1 and C2 and may be connected to each of the first and second solar cells C1 and C2.

The plurality of first and second conductive lines 200 may include a plurality of first conductive lines 210 that cross and overlap the plurality of first electrodes 141 included in each of the first and second solar cells C1 and C2 and are connected to the first electrodes 141, and a plurality of second conductive lines 220 that cross and overlap the plurality of second electrodes 142 included in each of the first and second solar cells C1 and C2 and are connected to the second electrodes 142.

More specifically, in each of the plurality of solar cells C1 and C2, the plurality of first conductive lines 210 may be connected to the first electrodes 141 at a plurality of crossings between the first conductive lines 210 and the first electrodes 141 through a first conductive adhesive 251 formed of a conductive material and may be insulated from the second electrodes 142 at a plurality of crossings between the first conductive lines 210 and the second electrodes 142 through an insulating layer 252 formed of an insulating material.

The insulating layer 252 may be made of any material as long as an insulating material is used. For example, the insulating layer 252 may use one insulating material of an epoxy-based resin, polyimide, polyethylene, an acrylic-based resin, and a silicon-based resin.

Further, in each of the plurality of solar cells C1 and C2, the plurality of second conductive lines 220 may be connected to the second electrodes 142 at a plurality of crossings between the second conductive lines 220 and the second electrodes 142 through the first conductive adhesive 251 and may be insulated from the first electrodes 141 at a plurality of crossings between the second conductive lines 220 and the first electrodes 141 through the insulating layer 252.

Each of the first and second conductive lines 200 may be formed of a conductive metal material and may include a conductive core including one of gold (Au), silver (Ag), copper (Cu) and aluminum (Al) and a conductive coating layer that coats a surface of the conductive core and includes tin (Sn) or Sn-containing alloy.

For example, the core may be formed of copper (Cu), and the coating layer may be formed of Sn-containing alloy, for example, SnBiAg.

One end connected to the interconnector 300 among both ends of the first conductive line 210 may protrude to the outside of a first side of the semiconductor substrate 110. One end connected to the interconnector 300 among both ends of the second conductive line 220 may protrude to the outside of a second side of the semiconductor substrate 110.

The first side may indicate a side of the semiconductor substrate 110, that crosses the conductive line 200 and is parallel to the first direction y. The second side may indicate a side opposite the first side of the semiconductor substrate 110.

Thus, one end of the first conductive line 210 and one end of the second conductive line 220 may protrude to the outside of a projection area of the semiconductor substrate 110. The other end of the first conductive line 210 and the other end of the second conductive line 220 may be positioned inside the projection area of the semiconductor substrate 110.

Each of the first and second conductive lines 200 may have a conductive wire shape having a circular cross section or a ribbon shape, in which a width is greater than a thickness.

A linewidth of each conductive line 200 shown in FIGS. 4 and 5 may be 0.5 mm to 2.5 mm in consideration of a reduction in the manufacturing cost while maintaining a line resistance of the conductive line 200 at a sufficiently low level. A distance between the first and second conductive lines 210 and 220 may be 4 mm to 6.5 mm in consideration of a total number of conductive lines 200, so that a short circuit current of the solar cell module is not damaged.

The number of each of the first and second conductive lines 210 and 220 connected to one solar cell may be 10 to 20. Thus, a sum of the number of first and second conductive lines 210 and 220 connected to one solar cell may be 20 to 40.

The first conductive adhesive 251 may be formed of a conductive metal material. The first conductive adhesive 251 may be formed as one of a solder paste, an epoxy solder paste, and a conductive paste.

Herein, the solder paste layer may be formed of tin (Sn) or Sn-containing alloy, and an epoxy solder paste layer may be formed of Sn or Sn-containing alloy included in an epoxy.

A structure of the first conductive adhesive 251 is described in detail with reference to figures subsequent to FIG. 15.

As shown in FIG. 4, the insulating layer 252 may be positioned between the first conductive line 210 and the second electrode 142 and between the second conductive line 220 and the first electrode 141 at a plurality of crossings between the first conductive lines 210 and the second electrodes 142 and a plurality of crossings between the second conductive lines 220 and the first electrodes 141.

Further, the insulating layers 252 positioned at the plurality of crossings between the first conductive lines 210 and the second electrodes 142 and the plurality of crossings between the second conductive lines 220 and the first electrodes 141 may be spaced apart from one another.

The insulating layer 252 may be made of any material as long as an insulating material is used. For example, the insulating layer 252 may use one insulating material of an epoxy-based resin, polyimide, polyethylene, an acrylic-based resin, and a silicon-based resin.

One end of each of the first and second conductive lines 200 may be connected to the interconnector 300 and may connect the plurality of solar cells in series.

More specifically, the interconnector 300 may be positioned between the first and second solar cells C1 and C2 and may extend in the first direction y.

As shown in FIGS. 3 and 4, the interconnector 300 may be spaced apart from the semiconductor substrate 110 of the first solar cell C1 and the semiconductor substrate 110 of the second solar cell C2 when viewed from the plane of the solar cell.

One end of the first conductive line 210 connected to the first electrode 141 of the first solar cell C1 and one end of the second conductive line 220 connected to the second electrode 142 of the second solar cell C2 may be commonly connected to the interconnector 300. The first and second solar cells C1 and C2 may be connected in series to each other in the second direction x.

More specifically, as shown in FIG. 5, the first and second solar cells C1 and C2, that are arranged in the second direction x as described above, may extend in the second direction x and may be connected in series to each other through the first and second conductive lines 200 and the interconnector 300 to form a string.

For example, as shown in FIG. 5, one end of each of the first and second conductive lines 200 may overlap the interconnector 300 and may be attached to the interconnector 300 through a second conductive adhesive 350.

The second conductive adhesive 350 attaching the first and second conductive lines 200 to the interconnector 300 may be formed of a metal material including tin (Sn) or Sn-containing alloy.

More specifically, the second conductive adhesive 350 may be formed of a solder paste including Sn or Sn-containing alloy, an epoxy solder paste in which Sn or Sn-containing alloy is included in an epoxy, or a conductive paste.

Because the solar cell module having the above-described structure includes the separate interconnector 300, when a bad connection between the first and second conductive lines 200 and the first and second electrodes 141 and 142 is generated among the plurality of solar cells, the first and second conductive lines 200 of a solar cell having the bad connection may be disconnected from the interconnector 300. Hence, only the bad solar cell can be easily replaced.

So far, the embodiment of the invention described the structure of the solar cell module, in which the first and second conductive lines 200 are connected to the back surface of each of the first and second solar cells C1 and C2, and the first and second solar cells C1 and C2 are connected in series to each other.

A detailed structure of a solar cell applicable to the first and second solar cells C1 and C2 is described below.

Figure 6:
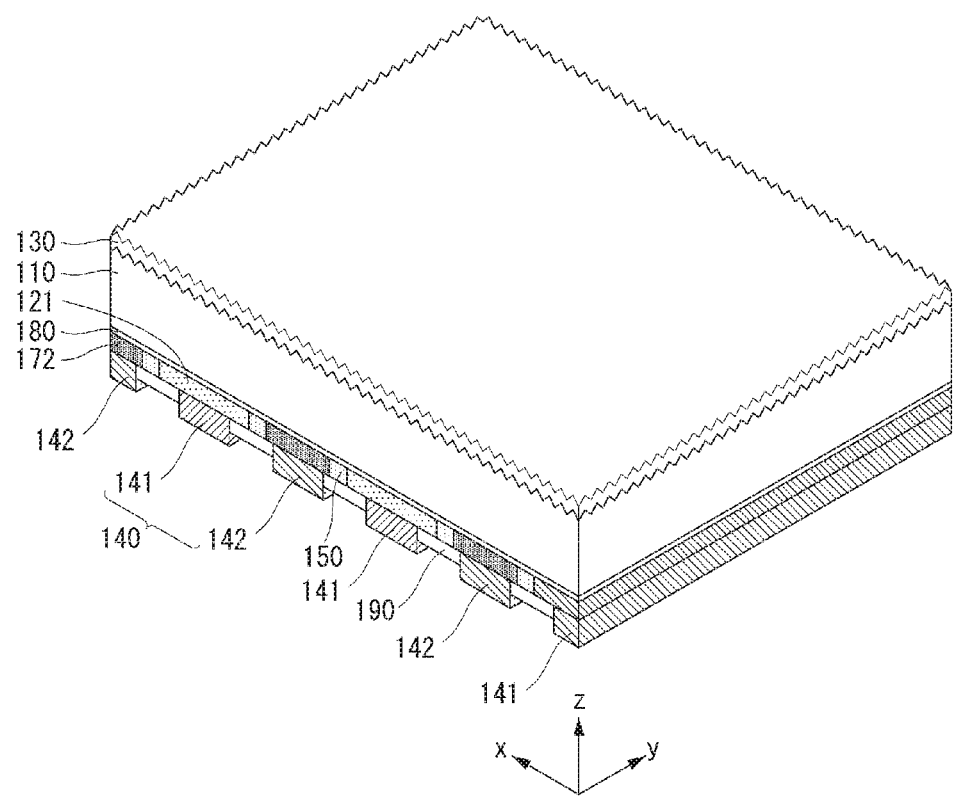
FIGS. 6 to 8 illustrate an example of a solar cell applied to an embodiment of the invention.
Figure 7:
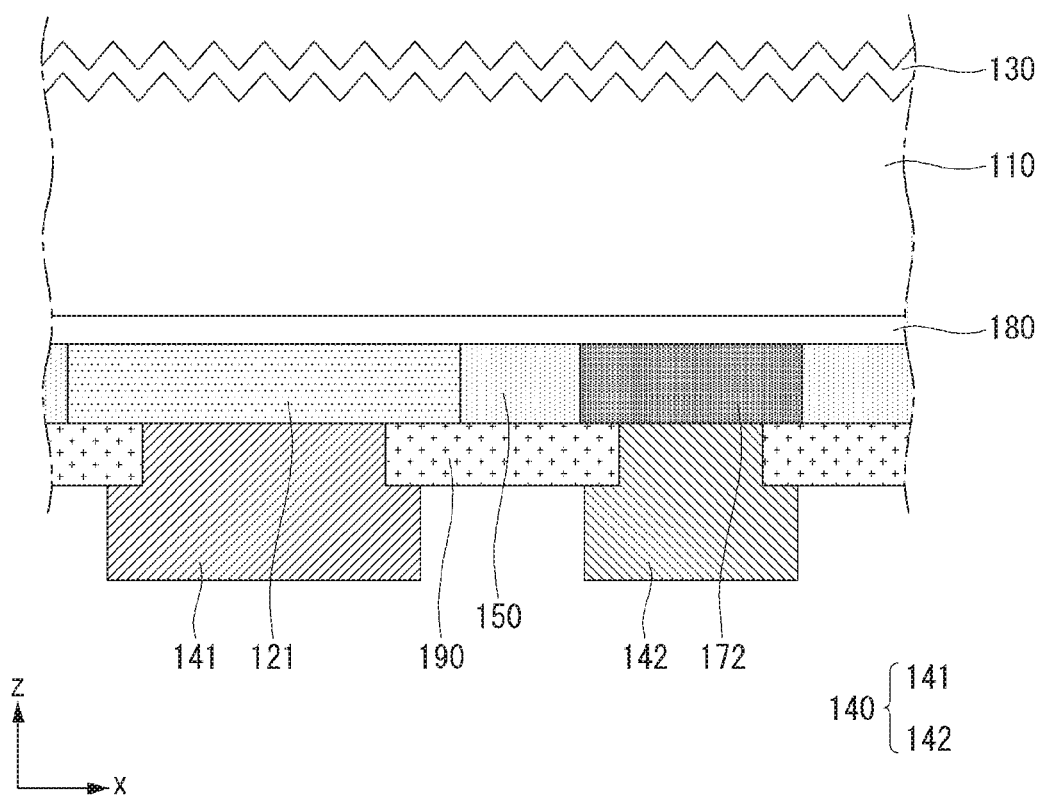
Figure 8:
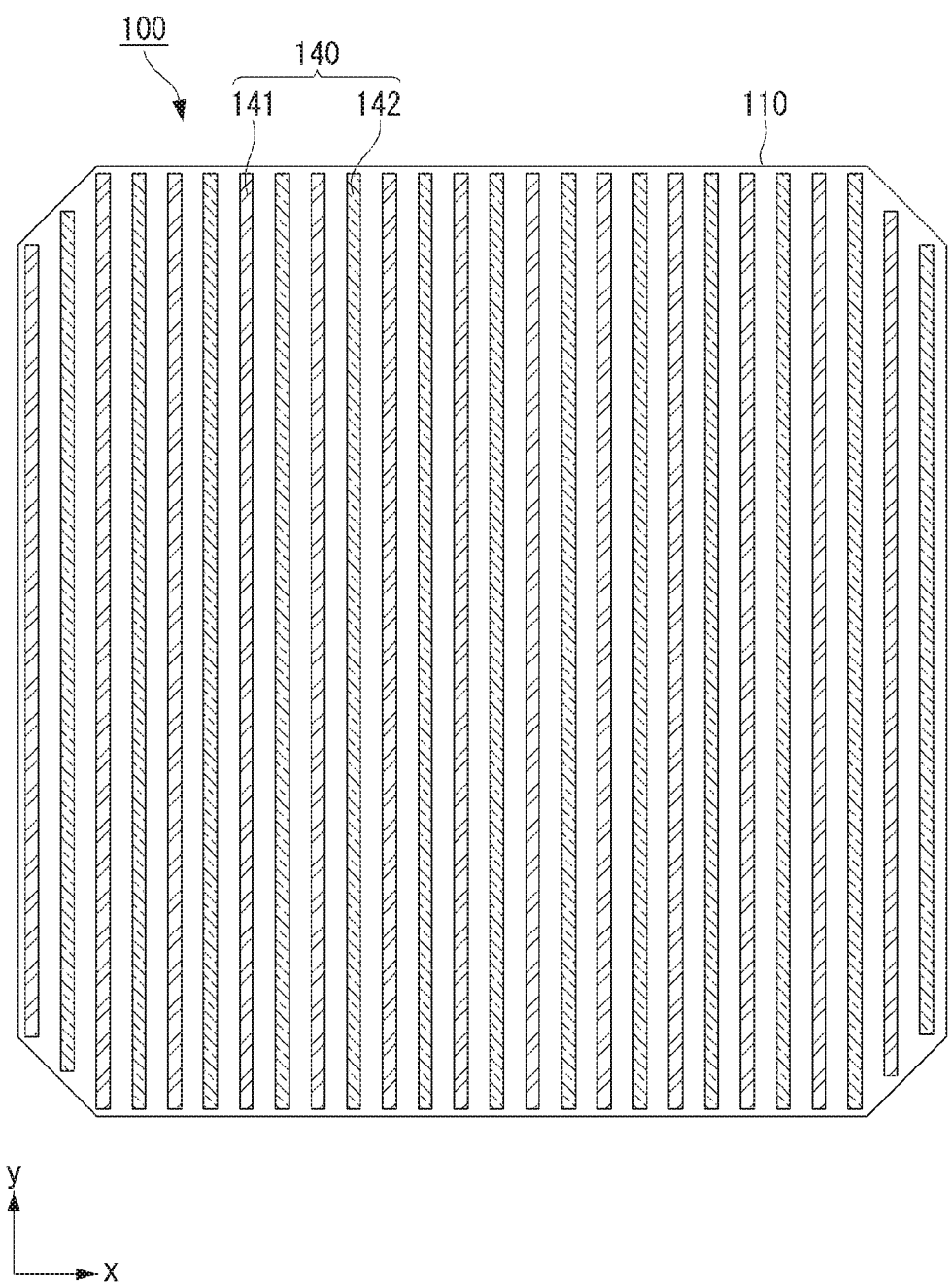

FIGS. 6 to 8 illustrate an example of a solar cell applied to an embodiment of the invention. More specifically, FIG. 6 is a partial perspective view illustrating an example of a solar cell applied to an embodiment of the invention. FIG. 7 is a cross-sectional view of a solar cell in a second direction. FIG. 8 illustrates a pattern of first and second electrodes formed on a back surface of a semiconductor substrate.

As shown in FIGS. 6 and 7, an example of a solar cell according to the embodiment of the invention may include an anti-reflection layer 130, a semiconductor substrate 110, a tunnel layer 180, a plurality of first semiconductor regions 121, a plurality of second semiconductor regions 172, a plurality of intrinsic semiconductor regions 150, a passivation layer 190, a plurality of first electrodes 141, and a plurality of second electrodes 142.

In the embodiment disclosed herein, the anti-reflection layer 130, the tunnel layer 180, and the passivation layer 190 may be omitted, if desired or necessary. However, when the solar cell includes them, efficiency of the solar cell may be further improved. Thus, the embodiment of the invention is described using the solar cell including the anti-reflection layer 130, the tunnel layer 180, and the passivation layer 190 by way of example.

The semiconductor substrate 110 may be formed of at least one of single crystal silicon and polycrystalline silicon containing impurities of a first conductive type or a second conductive type. For example, the semiconductor substrate 110 may be formed of a single crystal silicon wafer.

In the embodiment disclosed herein, the first conductive type or the second conductive type of the semiconductor substrate 110 may be one of an n-type and a p-type.

When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, the embodiment of the invention is described using an example where impurities contained in the semiconductor substrate 110 are impurities of the second conductive type and are n-type impurities. However, the embodiment of the invention is not limited thereto.

A front surface of the semiconductor substrate 110 may be an uneven surface having a plurality of uneven portions or having uneven characteristics. Thus, the first semiconductor regions 121 positioned on the front surface of the semiconductor substrate 110 may have an uneven surface.

Hence, an amount of light reflected from the front surface of the semiconductor substrate 110 may decrease, and an amount of light incident on the inside of the semiconductor substrate 110 may increase.

The anti-reflection layer 130 may be positioned on the front surface of the semiconductor substrate 110, so as to minimize a reflection of light incident on the front surface of the semiconductor substrate 110 from the outside. The anti-reflection layer 130 may be formed of at least one of aluminum oxide (AlOx), silicon nitride (SiNx), silicon oxide (SiOx), and silicon oxynitride (SiOxNy).

The tunnel layer 180 may be disposed on an entire back surface of the semiconductor substrate 110 while directly contacting the entire back surface of the semiconductor substrate 110 and may include a dielectric material. Thus, as shown in FIGS. 6 and 7, the tunnel layer 180 may pass through carriers produced in the semiconductor substrate 110.

In other words, the tunnel layer 180 may pass through carriers produced in the semiconductor substrate 110 and may perform a passivation function with respect to the back surface of the semiconductor substrate 110.

The tunnel layer 180 may be formed of a dielectric material including silicon carbide (SiCx) or silicon oxide (SiOx) having strong durability at a high temperature equal to or higher than 600° C. Other materials may be used.

As shown in FIGS. 6 and 7, the first semiconductor region 121 may be disposed on the back surface of the semiconductor substrate 110. For example, the first semiconductor region 121 may be disposed on a back surface of the tunnel layer 180 while directly contacting a portion of the back surface of the tunnel layer 180.

The first semiconductor regions 121 may extend in the first direction y at the back surface of the semiconductor substrate 110. The first semiconductor regions 121 may be formed of polycrystalline silicon material of the first conductive type opposite the second conductive type.

The first semiconductor regions 121 may be doped with impurities of the first conductive type. When impurities contained in the semiconductor substrate 110 is impurities of the second conductive type, the first semiconductor regions 121 may form a p-n junction together with the semiconductor substrate 110 with the tunnel layer 180 interposed therebetween.

Because each first semiconductor region 121 forms the p-n junction together with the semiconductor substrate 110, the first semiconductor region 121 may be of the p-type. When the first semiconductor region 121 is of the p-type, the first semiconductor region 121 may be doped with impurities of a group III element such as B, Ga, and In.

The plurality of second semiconductor regions 172 may be disposed at the back surface of the semiconductor substrate 110 and may extend in the first direction y parallel to the first semiconductor regions 121. For example, each second semiconductor region 172 may directly contact a portion (spaced apart from each first semiconductor region 121) of the back surface of the tunnel layer 180.

The second semiconductor regions 172 may be formed of polycrystalline silicon material more heavily doped than the semiconductor substrate 110 with impurities of the second conductive type. Thus, for example, when the semiconductor substrate 110 is doped with impurities of the second conductive type, i.e., n-type impurities, each second semiconductor region 172 may be an $n^+$-type region.

A potential barrier is formed by a difference in an impurity concentration between the semiconductor substrate 110 and the second semiconductor regions 172. Hence, the second semiconductor regions 172 can prevent or reduce holes from moving to the second semiconductor regions 172 used as a moving path of electrons through the potential barrier and can make it easier for carriers (for example, electrons) to move to the second semiconductor regions 172.

Thus, the embodiment of the invention can reduce an amount of carriers lost by a recombination and/or a disappearance of electrons and holes at and around the second semiconductor regions 172 or at and around the first and second electrodes 141 and 142 and can accelerates a movement of electrons, thereby increasing an amount of electrons moving to the second semiconductor regions 172.

So far, FIGS. 6 and 7 illustrate that the semiconductor substrate 110 is doped with impurities of the second conductive type, the first semiconductor regions 121 serve as an emitter region, and the second semiconductor regions 172 serve as a back surface field region, by way of example.

However, when the semiconductor substrate 110 is doped with impurities of the first conductive type unlike FIGS. 6 and 7, the first semiconductor regions 121 may serve as a back surface field region, and the second semiconductor regions 172 may serve as an emitter region.

Further, FIGS. 6 and 7 illustrate that the first semiconductor regions 121 and the second semiconductor regions 172 are formed on the back surface of the tunnel layer 180 using polycrystalline silicon material, by way of example.

However, if the tunnel layer 180 is omitted unlike FIGS. 6 and 7, the first semiconductor regions 121 and the second semiconductor regions 172 may be doped by diffusing impurities into the back surface of the semiconductor substrate 110. In this instance, the first semiconductor regions 121 and the second semiconductor regions 172 may be formed of the same material (for example, single crystal silicon) as the semiconductor substrate 110.

As shown in FIGS. 6 and 7, the intrinsic semiconductor layer 150 may be formed on the back surface of the tunnel layer 180 exposed between the first semiconductor region 121 and the second semiconductor region 172. The intrinsic semiconductor layer 150 may be formed as an intrinsic polycrystalline silicon layer, that is not doped with impurities of the first conductive type or impurities of the second conductive type, unlike the first semiconductor region 121 and the second semiconductor region 172.

Further, as shown in FIGS. 6 and 7, the intrinsic semiconductor layer 150 may be configured such that both sides directly contact the side of the first semiconductor region 121 and the side of the second semiconductor region 172, respectively.

The passivation layer 190 removes a defect resulting from a dangling bond formed in a back surface of a polycrystalline silicon layer formed at the first semiconductor regions 121, the second semiconductor regions 172, and the intrinsic semiconductor layers 150, and thus can prevent carriers produced in the semiconductor substrate 110 from being recombined and disappeared by the dangling bond.

As shown in FIG. 8, the plurality of first electrodes 141 may be connected to the first semiconductor regions 121 and may extend in the first direction y. The first electrodes 141 may collect carriers (for example, holes) moving to the first semiconductor regions 121.

The plurality of second electrodes 142 may be connected to the second semiconductor regions 172 and may extend in the first direction y in parallel with the first electrodes 141. The second electrodes 142 may collect carriers (for example, electrons) moving to the second semiconductor regions 172.

As shown in FIG. 8, the first and second electrodes 141 and 142 may extend in the first direction y and may be spaced apart from each other in the second direction x. Further, the first and second electrodes 141 and 142 may be alternately disposed in the second direction x.

In the solar cell having the above-described structure according to the embodiment of the invention, holes collected by the first electrodes 141 and electrons collected by the second electrodes 142 may be used as electric power of an external device through an external circuit device.

The solar cell applied to the solar cell module according to the embodiment of the invention is not limited to FIGS. 6 and 7. The components of the solar cell may be variously changed, except that the first and second electrodes 141 and 142 included in the solar cell are formed on the back surface of the semiconductor substrate 110.

For example, the solar cell module according to the embodiment of the invention may use a metal wrap through (MWT) solar cell, that is configured such that a portion of the first electrode 141 and the first semiconductor region 121 are positioned on the front surface of the semiconductor substrate 110, and the portion of the first electrode 141 is connected to a remaining portion of the first electrode 141 formed on the back surface of the semiconductor substrate 110 through a hole of the semiconductor substrate 110.

The first conductive adhesive 251 according to the embodiment of the invention may include a first adhesive layer 251a and a second adhesive layer 251b each having a different melting point. This is described in detail below.

Figure 9:
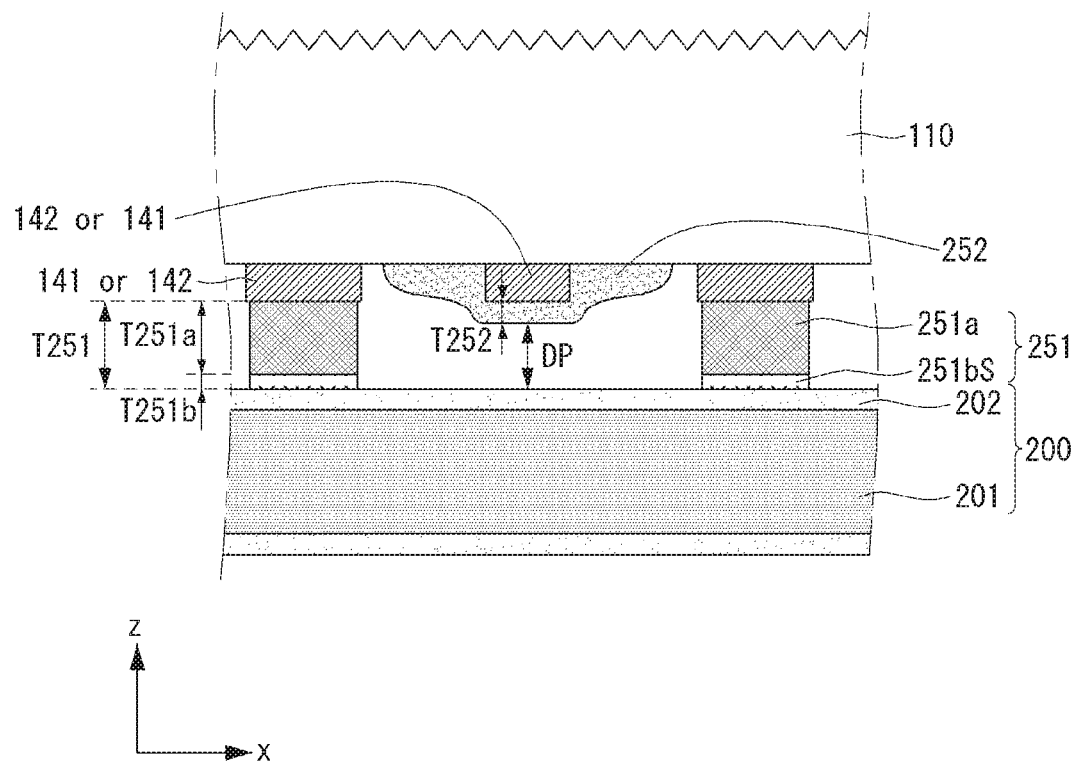
FIGS. 9 to 11 illustrate a first example of a first conductive adhesive according to an embodiment of the invention.
Figure 10:
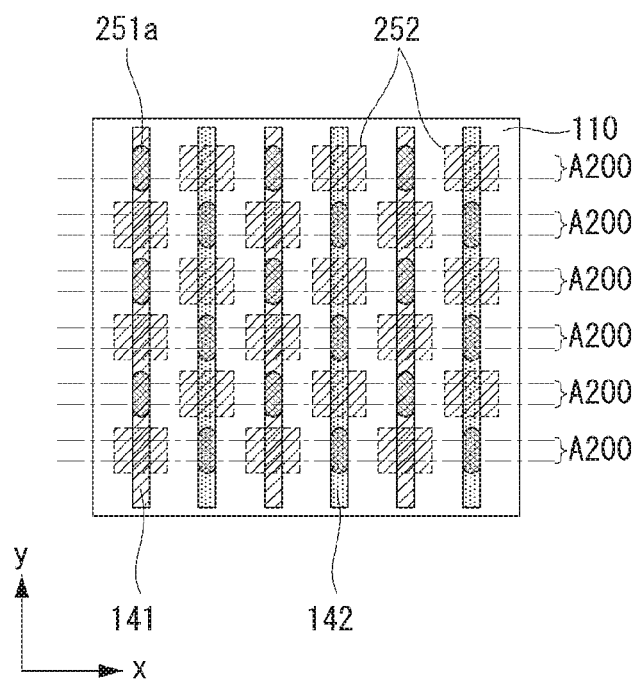
Figure 11:
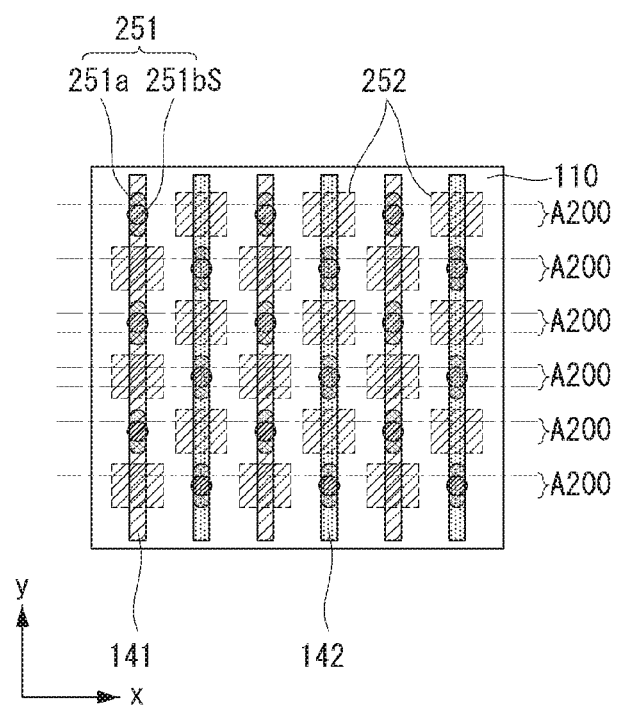

FIGS. 9 to 11 illustrate a first example of a first conductive adhesive according to an embodiment of the invention.

More specifically, FIG. 9 is a partial enlarged view of a cross section of the solar cell module shown in FIG. 5 in order to describe in detail a first conductive adhesive. FIG. 10 schematically illustrates an example where a first adhesive layer and an insulating layer are formed on a back surface of a semiconductor substrate, on which first and second electrodes are formed. FIG. 11 illustrates an example of a second adhesive layer applied to a back surface of a semiconductor substrate, on which a first adhesive layer and an insulating layer are formed.

The description duplicative with that illustrated in FIGS. 1 to 8 is omitted in FIGS. 9 to 11, and only a difference between FIGS. 1 to 8 and FIGS. 9 to 11 is mainly described.

As shown in FIG. 9, in one solar cell included in the solar cell module according to the embodiment of the invention, a first conductive adhesive 251 may be positioned between the first electrode 141 and the first conductive line 210 or between the second electrode 142 and the second conductive line 220.

An insulating layer 252 may be positioned between the first electrode 141 and the second conductive line 220 or between the second electrode 142 and the first conductive line 210.

As shown in FIG. 9, the first conductive adhesive 251 may be positioned on one of the first and second electrodes crossing the conductive line 200, and the insulating layer 252 may be positioned on the other electrode and on the back surface of the semiconductor substrate 110 around the other electrode.

Thus, the insulating layer 252 may completely insulate one of the first and second electrodes from the conductive line 200 not requiring an electrical connection.

As shown in FIG. 9, the first conductive adhesive 251 may include a first adhesive layer 251a and a second adhesive layer 251b each having a different melting point.

The first adhesive layer 251a may be positioned between the electrode 141 or 142 and the conductive line 200 while being directly attached to the electrode 141 or 142.

Namely, the first adhesive layer 251a may be positioned at a plurality of crossings between the first conductive lines 210 and the first electrodes 141 and a plurality of crossings between the second conductive lines 220 and the second electrodes 142.

Further, the first adhesive layers 251a may be spaced apart from one another between the plurality of crossings between the first conductive lines 210 and the first electrodes 141 and between the plurality of crossings between the second conductive lines 220 and the second electrodes 142 in the second direction x.

The second adhesive layer 251b may be positioned on the first adhesive layer 251a and may be connected to the plurality of conductive lines 200.

Namely, the second adhesive layer 251b may be disposed between the first adhesive layer 251a and the conductive line 200 while being directly attached to the first adhesive layer 251a and the conductive line 200.

The second adhesive layer 251b may be formed in accordance with a case 1 in which the second adhesive layer 251b has entirely a short pattern 251bS, a case 2 in which the second adhesive layer 251b has entirely a long pattern 251bL, or a case 3 in which a portion of the second adhesive layer 251b has the short pattern 251bS, and a remaining portion of the second adhesive layer 251b has the long pattern 251bL.

In the embodiment disclosed herein, the short pattern 251bS indicates a pattern, in which the second adhesive layers 251b are respectively positioned on the first adhesive layers 251a, each have a relatively short length in the second direction x, and are spaced between the crossings.

Further, the long pattern 251bL indicates a pattern, in which the second adhesive layer 251b is positioned to overlap the first adhesive layer 251a and the insulating layer 252, has a length in the second direction x longer than a length of the first adhesive layer 251a in the second direction x, is not spaced between the crossings, and is extended between the crossings.

Figure 12:
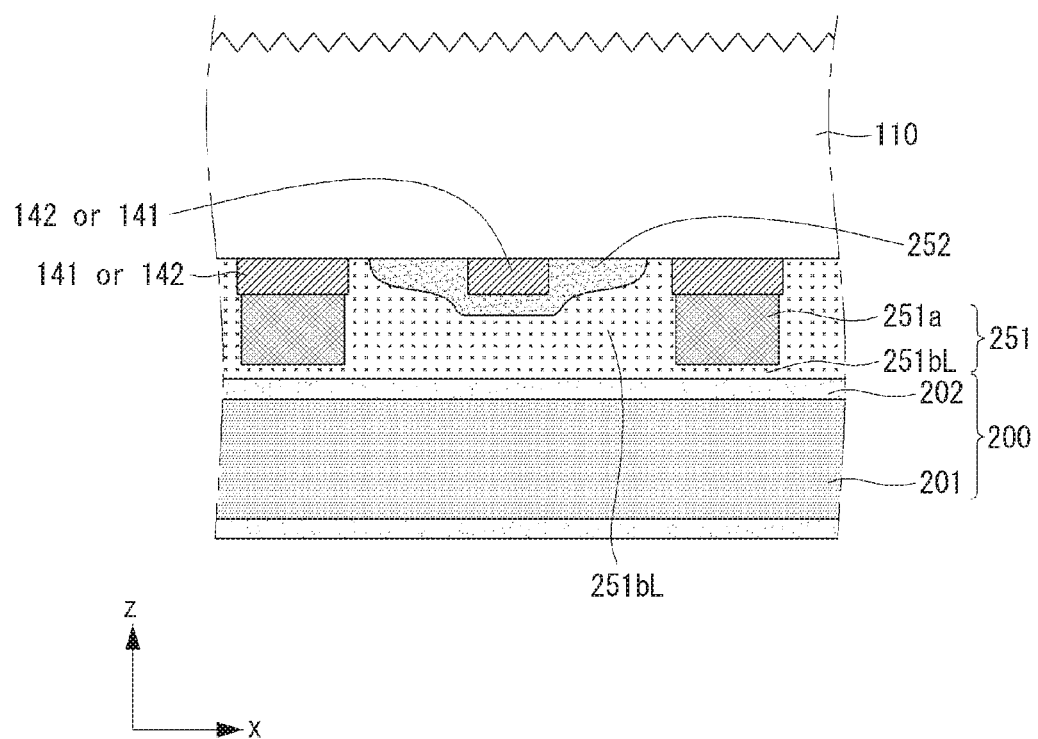
FIGS. 12 and 13 illustrate a second example of a first conductive adhesive according to an embodiment of the invention.
Figure 13:
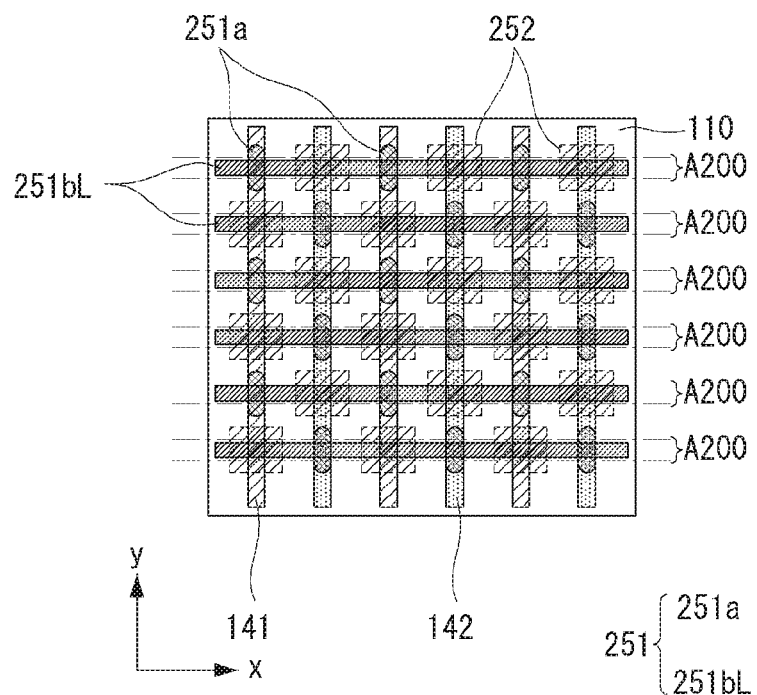

The case 1 is described in FIGS. 9 to 11, the case 2 is described in FIGS. 12 and 13, and the case 3 is described in FIGS. 14 to 24.

Thus, because the second adhesive layer 251b shown in FIGS. 9 to 11 is entirely formed in only the short pattern 251bS, only the short pattern 251bS is shown in FIGS. 9 to 11. Further, because the second adhesive layer 251b shown in FIGS. 12 and 13 is entirely formed in only the long pattern 251bL, only the long pattern 251bL is shown in FIGS. 12 and 13.

Hereinafter, the first example of the first conductive adhesive 251 is described, on the assumption that the second adhesive layer 251b is formed in only the short pattern 251bS, with reference to FIGS. 9 to 11.

In FIGS. 9 to 11, the second adhesive layer 251b may include a material different from a material of the first adhesive layer 251a, and a melting point of the second adhesive layer 251b may be different from a melting point of the first adhesive layer 251a.

More specifically, the melting point of the first adhesive layer 251a may be higher than a first temperature of the lamination process for modularizing the plurality of solar cells, and the melting point of the second adhesive layer 251b may be equal to or lower than the first temperature of the lamination process.

For example, the melting point of the first adhesive layer 251a may be higher than a predetermined temperature (for example, the first temperature) belonging to a temperature range (for example, 160° C. to 170° C.) of the lamination process. The melting point of the second adhesive layer 251b may be equal to or lower than the first temperature between 160° C. and 170° C.

For example, the melting point of the first adhesive layer 251a may be higher than the first temperature between 160° C. and 170° C. and may be equal to or lower than 300° C. The melting point of the second adhesive layer 251b may be equal to or higher than 110° C. and may be lower than the first temperature.

Hence, the first adhesive layer 251a may not melt during the lamination process and may maintain its form. Further, the first adhesive layer 251a attached to the electrode 141 or 142 may be attached to the conductive line 200 through the second adhesive layer 251b that melts during the lamination process.

The first conductive adhesive 251 according to the embodiment of the invention may be configured such that the second adhesive layer 251b is positioned in a portion directly contacting the conductive line 200, and a melting point of the second adhesive layer 251b is relatively low. Hence, a tabbing process for attaching the conductive lines 200 to the back surface of the semiconductor substrate 110 can be performed during the lamination process for modularizing the plurality of solar cells, and thus the manufacturing process of the solar cell module may be further simplified.

As the tabbing process for attaching the conductive lines 200 to the back surface of the semiconductor substrate 110 is performed at a relatively low temperature (for example, 160° C. to 170° C.), a thermal expansion stress of the conductive lines 200 can be minimized. Further, a defect of the solar cell module, in which the conductive line 200 is not electrically connected to a portion of the electrode and is disconnected from the electrode by the separation of the conductive line 200 resulting from a thermal expansion, can be minimized.

The first adhesive layer 251a and the second adhesive layer 251b of the first conductive adhesive 251 may be formed of a metal material including tin (Sn) or Sn-containing alloy.

The first conductive adhesive 251 may be formed of one of a solder paste including Sn or Sn-containing alloy, an epoxy solder paste in which Sn or Sn-containing alloy is included in an epoxy, and a conductive paste.

For example, when the first adhesive layer 251a uses the solder paste, the solder paste of the first adhesive layer 251a may include at least one material of Sn, SnAgCu, SnPb, SnBiCuCo, SnBiAg, SnPbAg, or SnAg.

Further, when the second adhesive layer 251b uses the solder paste, the solder paste of the second adhesive layer 251b may include at least one material of SnBi and SnIn.

Alternatively, when the first adhesive layer 251a uses the epoxy solder paste, an epoxy resin of the first adhesive layer 251a may include at least one material of Sn, SnAgCu, SnPb, SnBiCuCo, SnBiAg, SnPbAg, or SnAg.

Further, when the second adhesive layer 251b uses the epoxy solder paste, an epoxy resin of the second adhesive layer 251b may include at least one material of SnBi and SnIn.

As shown in FIGS. 9 to 11, when the second adhesive layers 251b are entirely formed in only the short pattern 251bS, the second adhesive layers 251b may be respectively positioned on the first adhesive layers 251a and may be arranged to be spaced apart from one another in the second direction x corresponding to the longitudinal direction of the conductive line 200.

Namely, the second adhesive layers 251b having the short pattern 251bS may be respectively positioned at a plurality of crossings between the first conductive lines 210 and the first electrodes 141 and may be spaced apart from one another between the plurality of crossings in the second direction x.

Further, the second adhesive layers 251b having the short pattern 251bS may be respectively positioned at a plurality of crossings between the second conductive lines 220 and the second electrodes 142 and may be spaced apart from one another between the plurality of crossings.

Thus, an arrangement of the second adhesive layers 251b having the short pattern 251bS in the second direction x may be substantially the same as an arrangement of the first adhesive layers 251a in the second direction x.

The second adhesive layer 251b having the short pattern 251bS may not be positioned on the insulating layer 252. This is described in detail with reference to FIGS. 10 and 11.

As shown in FIG. 9, a thickness T251 of the first conductive adhesive 251 between one of the electrodes 141 or 142 and the conductive line 200 may be greater than a thickness T252 of the insulating layer 252 between the other electrode and the conductive line 200.

For example, a thickness T251 of the first conductive adhesive 251 between the first electrode 141 and the first conductive line 210 may be greater than a thickness T252 of the insulating layer 252 between the second electrode 142 and the first conductive line 210. On the contrary, a thickness T251 of the first conductive adhesive 251 between the second electrode 142 and the second conductive line 220 may be greater than a thickness T252 of the insulating layer 252 between the first electrode 141 and the second conductive line 220.

For example, the thickness T251 of the first conductive adhesive 251 may be 10 μm to 150 μm, and the thickness T252 of the insulating layer 252 may be less than the thickness T251 of the first conductive adhesive 251 and may be 1 μm to 50 μm.

In the embodiment disclosed herein, the thickness T252 of the insulating layer 252 indicates a thickness of a portion of the insulating layer 252 positioned between the electrode 141 or 142 and the conductive line 200.

As shown in FIG. 9, the first conductive adhesive 251 positioned on each electrode may be attached to the conductive line 200, and a distance between the electrode 141 or 142 and the conductive line 200 may be substantially equal to a thickness T251 of the first conductive adhesive 251. Therefore, the insulating layer 252 and the conductive line 200 may be spaced apart from each other by a predetermined distance DP.

A thickness T251b of the second adhesive layer 251b between the first adhesive layer 251a and the conductive line 200 may be less than a thickness T251a of the first adhesive layer 251a.

A ratio of the thickness T251a of the first adhesive layer 251a to the thickness T251b of the second adhesive layer 251b may be 1:1/10 to 1:1/2, and the thickness T251a of the first adhesive layer 251a may be greater than the thickness T251b of the second adhesive layer 251b.

For example, when the thickness T251a of the first adhesive layer 251a is 9 μm to 100 μm, the thickness T251b of the second adhesive layer 251b may be 1 μm to 50 μm within a range of 1/10 to 1/2 of the thickness T251a of the first adhesive layer 251a.

As described above, the embodiment of the invention may further increase the thickness T251a of the first adhesive layer 251a, that does not melt in the lamination process, compared to the thickness T252 of the insulating layer 252, thereby previously preventing the electrode 141 or 142, that has to be connected to the conductive line 200, from being disconnected from the conductive line 200.

Further, as the thickness T251b of the second adhesive layer 251b is set to be remarkably less than the thickness T251a of the first adhesive layer 251a, the second adhesive layer 251b may be prevented from spreading to an unwanted area in the lamination process.

For example, if the second adhesive layer 251b is excessively thick, the second adhesive layer 251b may widely spread to a non-formation portion of the insulating layer 252 in the electrode 141 or 142 that melts and has to be insulated from the conductive line 200 during the lamination process. Hence, an unwanted short circuit may be generated. Thus, the embodiment of the invention can prevent the unwanted short circuit as described above.

A separation space between the first and second electrodes 141 and 142 and a separation space between the insulating layer 252 and the conductive line 200 may be filled with ethylene vinyl acetate (EVA) that is between the front surfaces and the back surfaces of the solar cells and protects the solar cells from an external impact and moisture, in the lamination process.

Each of the first and second conductive lines 210 and 220 may include a core 201 and a coating layer 202.

The core 201 may include at least one of copper (Cu) and aluminum (Al). The coating layer 202 may include tin (Sn). For example, the coating layer 202 may include at least one of SnPb, SnAgCu, SnBiAg, SnBi, Sn, or SnAg.

A thickness of the core 201 may be 50 μm to 250 μm, and a thickness of the coating layer 202 may be 1 μm to 30 μm.

A method for manufacturing the solar cell module, that is configured such that the first conductive adhesive 251 includes the first adhesive layer 251a and the second adhesive layer 251b, is described with reference to FIGS. 10 and 11.

An example of a method for manufacturing the solar cell module according to the embodiment of the invention may include forming the first adhesive layer 251a and the insulating layer 252 on the back surface of the semiconductor substrate 110, applying the second adhesive layer 251b, arranging the conductive lines 200, and performing the lamination process.

The forming of the first adhesive layer 251a and the insulating layer 252 on the back surface of the semiconductor substrate 110 may include forming the first adhesive layer 251a on one of the first and second electrodes 141 and 142, each of which has a different polarity and extends in the first direction y on the back surface of the semiconductor substrate 110, and forming the insulating layer 252 on the other electrode.

For example, as shown in FIG. 10, when the first and second electrodes 141 and 142 extend in the first direction y on the back surface of the semiconductor substrate 110, and the conductive line 200 extends in the second direction x along an area A200, in which the conductive line 200 is formed, the first adhesive layer 251a may be formed on a portion of each of the first and second electrodes 141 and 142, that will be connected to the conductive line 200 in the area A200, and the insulating layer 252 may be formed on a portion of each of the first and second electrodes 141 and 142, that will be insulated from the conductive line 200 in the area A200.

The first adhesive layer 251a may be formed of a material, of which a melting point is higher than a temperature of the lamination process for modularizing the plurality of solar cells. The insulating layer 252 may be formed of a material, of which a melting point is higher than a temperature of the lamination process.

Afterwards, the second adhesive layer 251b, of which a melting point is lower than a melting point of the first adhesive layer 251a, may be applied to the first adhesive layer 251a.

In this instance, the melting point of the second adhesive layer 251b may be equal to or lower than the temperature of the lamination process.

Next, the applying of the second adhesive layer 251b may include applying the second adhesive layer 251b to a formation portion of the first adhesive layer 251a so that the second adhesive layers 251b are spaced apart from one another in the second direction x, to form the second adhesive layer 251b in the short pattern 251bS.

As the second adhesive layer 251b is configured as described above, the embodiment of the invention can reduce the manufacturing cost of the solar cell module by minimizing the use of the second adhesive layer 251b. Further, the embodiment of the invention can prevent an unwanted short circuit by preventing the second adhesive layer 251b from widely spreading to an unnecessary portion in the lamination process.

Next, the arranging of the conductive lines 200 may include disposing each conductive line 200 in the area A200 so that the conductive line 200 overlaps the first and second adhesive layers and the insulating layer 252 in the second direction x. The performing of the lamination process may include applying heat and pressure and attaching the second adhesive layer 251b to the conductive line 200 to form the solar cell module shown in FIGS. 1 to 4. In this instance, the temperature of the lamination process may be, for example, 160° C. to 170° C.

In the performing of the lamination process, only the second adhesive layer 251b among the first and second adhesive layers 251a and 251b may melt and may be attached to the conductive lines 200. Hence, a defect rate of the solar cell module can be greatly reduced by preventing the unwanted short circuit.

Further, in the performing of the lamination process, a separation space between the first and second electrodes 141 and 142 and a separation space between the insulating layer 252 and the conductive line 200 may be filled with ethylene vinyl acetate (EVA).

So far, the embodiment of the invention described the case 1, in which the second adhesive layer 251b is positioned on the first adhesive layer 251a and is formed in the short patterns 251bS spaced apart from one another in the second direction x, by way of example.

However, unlike the case 1, the second adhesive layer 251b may be formed in accordance with the case 2 in which the second adhesive layer 251b is formed entirely in a long pattern 251bL.

Thus, the second adhesive layer 251b having the long pattern 251bL may not be spaced and may be extended in a stripe shape in the second direction x.

The case 2 of the second adhesive layer 251b is described in detail below.

FIGS. 12 and 13 illustrate a second example of a first conductive adhesive according to an embodiment of the invention.

The description duplicative with that illustrated in FIGS. 1 to 11 is omitted in FIGS. 12 and 13, and only a difference between FIGS. 1 to 11 and FIGS. 12 and 13 is mainly described.

A second adhesive layer 251b may be formed entirely in a long pattern 251bL, that is extended in the second direction x corresponding to a longitudinal direction of first and second conductive lines 200 and is formed in a stripe shape.

Namely, each second adhesive layer 251b may be formed in the long pattern 251bL, that is positioned to overlap a first adhesive layer 251a and an insulating layer 252, has a length in the second direction x longer than a length of the first adhesive layer 251a in the second direction x, is not spaced between crossings, and is extended between the crossings.

Thus, as shown in FIG. 12, the second adhesive layer 251b formed in the long pattern 251bL may be further positioned in a separation space between the insulating layer 252 and the conductive line 200.

A method for forming the second adhesive layer 251b formed in the long pattern 251bL in the separation space between the insulating layer 252 and the conductive line 200 is described below.

After the first adhesive layer 251a and the insulating layer 252 are formed on the back surface of the semiconductor substrate 110 as shown in FIG. 10, the second adhesive layer 251b may be applied to a formation portion of the first adhesive layer 251a as shown in FIG. 13 while the second adhesive layer 251b is not separated in the second direction x and is successively formed in the stripe shape.

In this instance, the second adhesive layer 251b may be formed in the long pattern 251bL applied to the insulating layer 252 and the back surface of the semiconductor substrate 110 exposed between the first and second electrodes 141 and 142.

Afterwards, as shown in FIG. 12, when the lamination process is performed in a state where the conductive lines 200 are disposed on the back surface of the semiconductor substrate 110, the second adhesive layer 251b may be further positioned in the separation space between the insulating layer 252 and the conductive line 200.

In this instance, the second adhesive layer 251b may be prevented from widely spreading in the lamination process by properly adjusting a viscosity of the second adhesive layer 251b.

Hence, durability of the solar cell module may be further improved.

So far, the embodiment of the invention described that the second adhesive layer 251b is formed in the short pattern 251bS (the case 1) or the long pattern 251bL (the case 2) on the entire back surface of the semiconductor substrate 110 by way of example while describing the first conductive adhesive 251 including the first adhesive layer 251a and the second adhesive layer 251b each having a different melting point.

The second adhesive layer 251b may be formed in accordance with the case 3, in which the case 1 and the case 2 are mixed with each other.

The case 3, in which a portion of the second adhesive layer 251b is formed in the short pattern 251bS, and a remaining portion of the second adhesive layer 251b is formed in the long pattern 251bL, is described below.

A length of the first conductive adhesive 251 connecting the first and second conductive lines 200 to the back surface of each of the plurality of solar cells may have different values in first and second areas of the back surface of the semiconductor substrate 110.

The first area of the back surface of the semiconductor substrate 110 may be a middle portion of the back surface of the semiconductor substrate 110, and the second area may be edge portions of the semiconductor substrate 110, that are positioned at both edges of the middle portion of the semiconductor substrate 110 in the second direction.

In the following description, the embodiment of the invention is described using an example where the first area is the middle portion of the semiconductor substrate 110, and the second area is the edge portion of the semiconductor substrate 110.

This is described in detail below.

FIGS. 14 to 22 illustrate a third example of a first conductive adhesive according to an embodiment of the invention.

Figure 14:
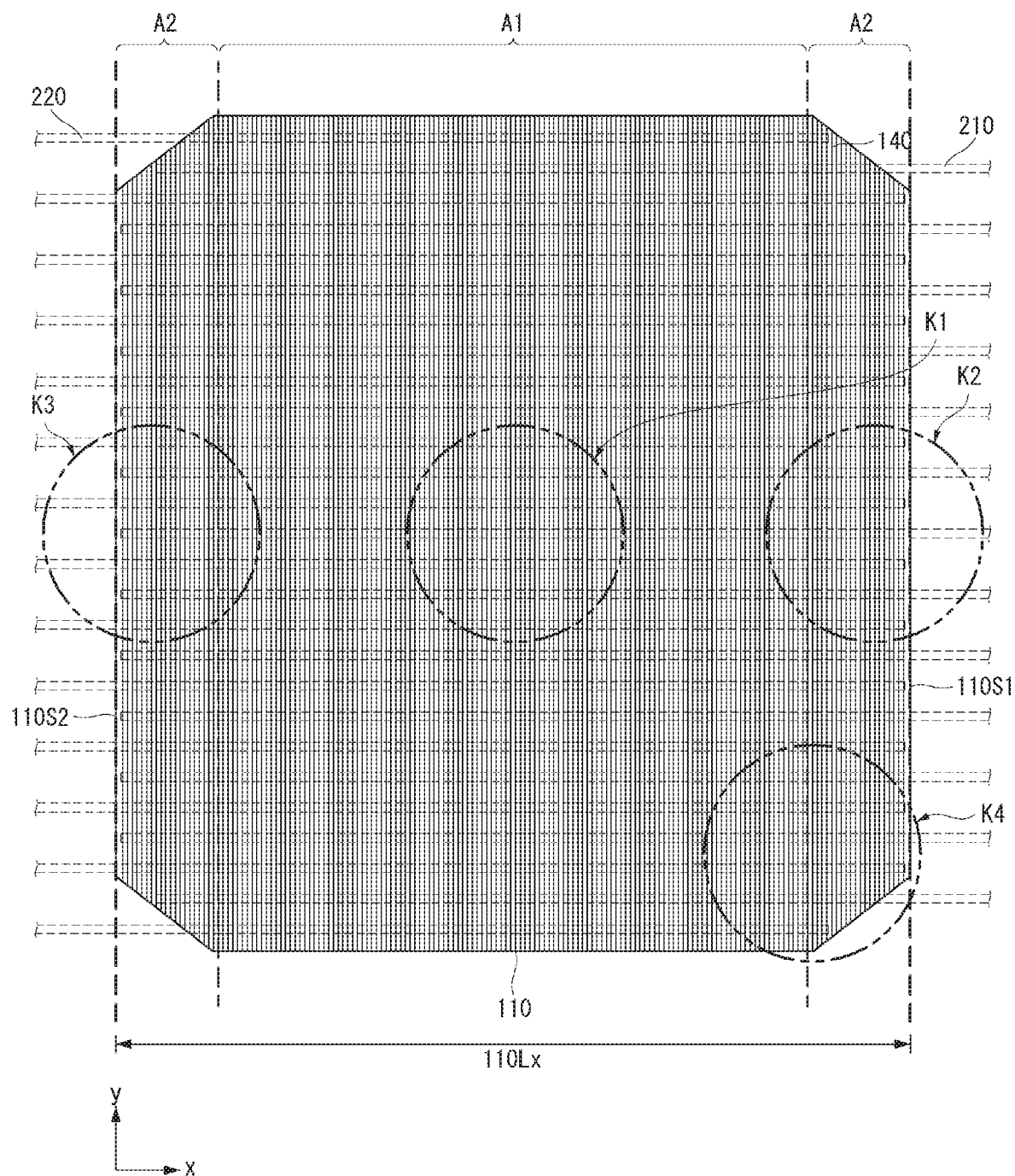
FIGS. 14 to 22 illustrate a third example of a first conductive adhesive according to an embodiment of the invention.

More specifically, FIG. 14 illustrates a middle portion A1 and an edge portion A2 of a semiconductor substrate 110 shown in FIG. 8.

Figure 15:
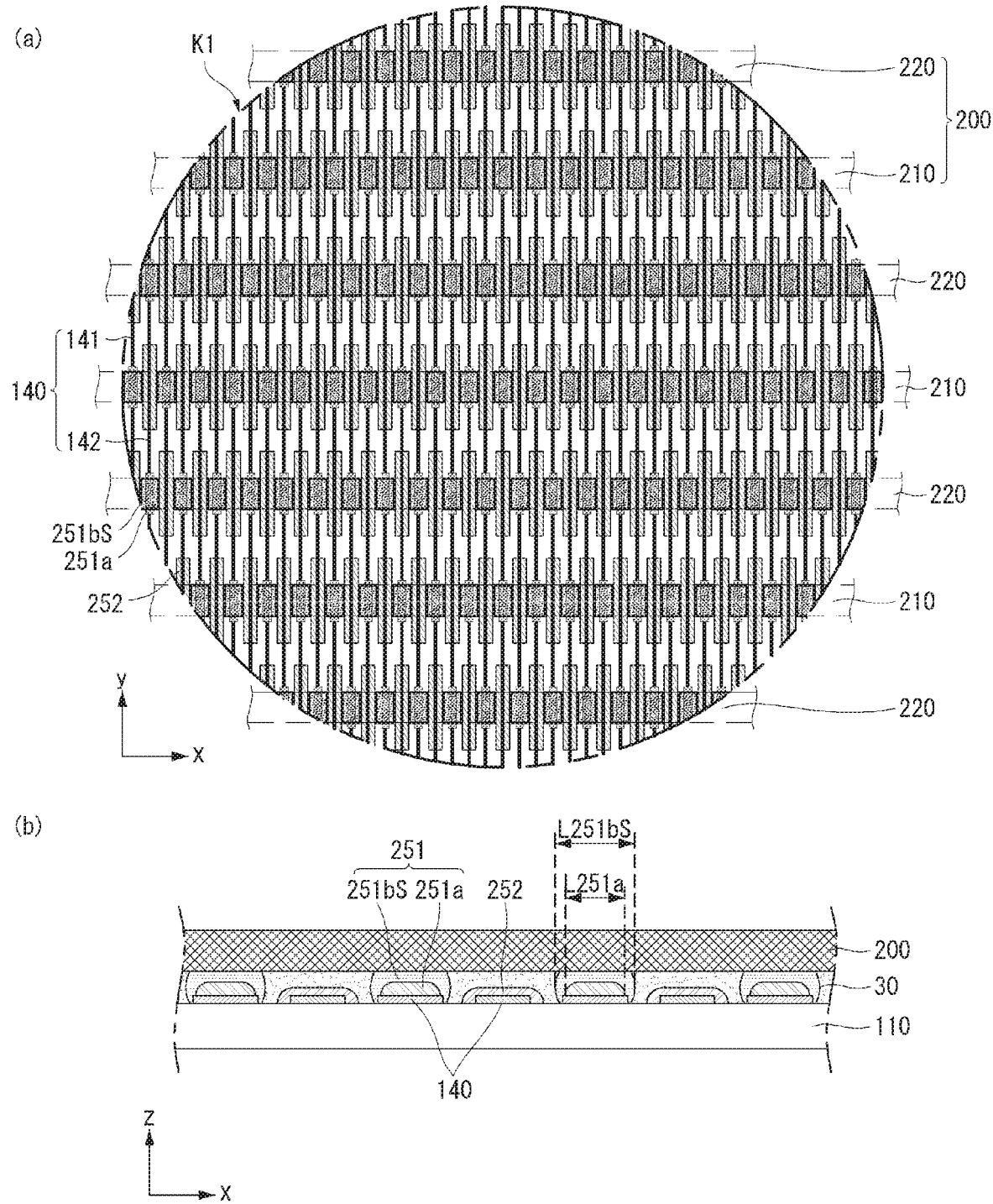

Furthermore, FIG. 15 enlargedly illustrates an area K1 in order to describe a first example of a plane pattern of a first conductive adhesive 251 positioned in a middle portion A1 of a semiconductor substrate 110 shown in FIG. 14. More specifically, (a) of FIG. 15 is a plan view of an area K1, and (b) of FIG. 15 is a cross-sectional view of an area K1 in a second direction x in order to describe a cross-sectional structure of a first conductive adhesive 251 in the area K1.

Figure 16:
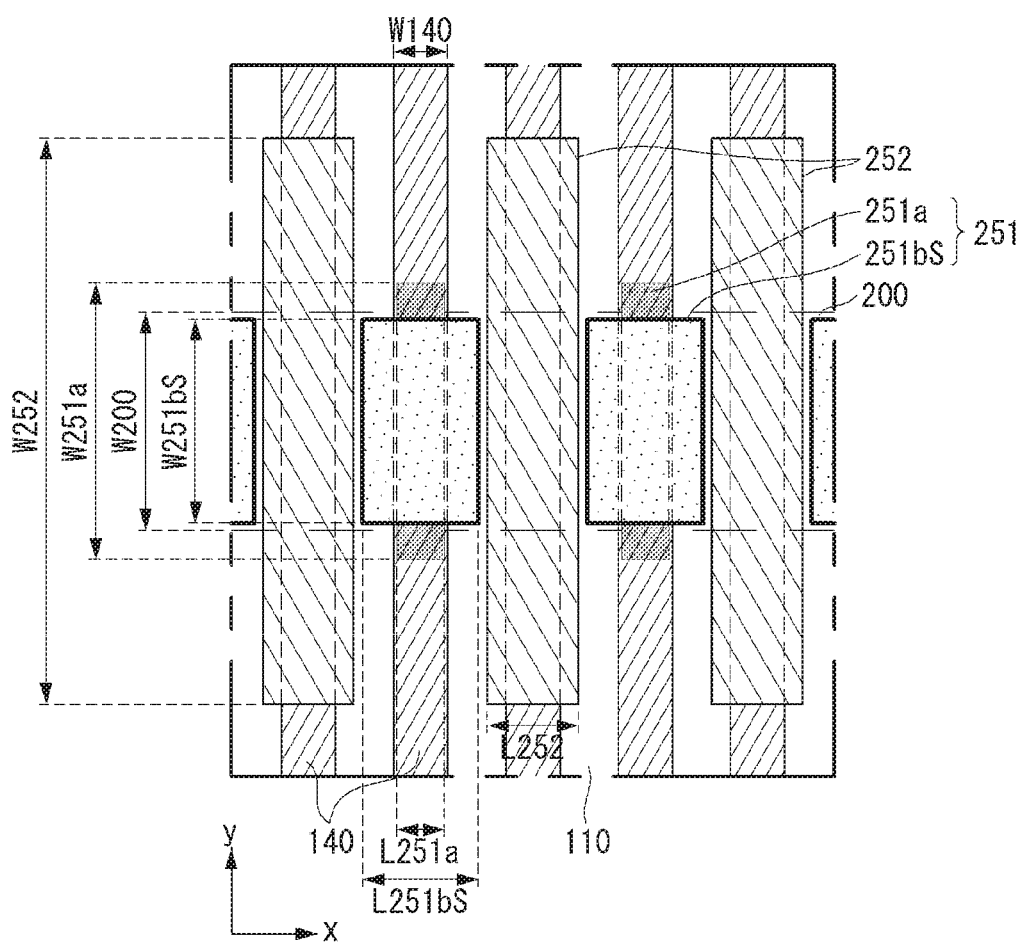

FIG. 16 enlargedly illustrates an area K1 in order to describe in detail a plane pattern of a first conductive adhesive 251 positioned in a middle portion A1 of a semiconductor substrate 110.

Figure 17:
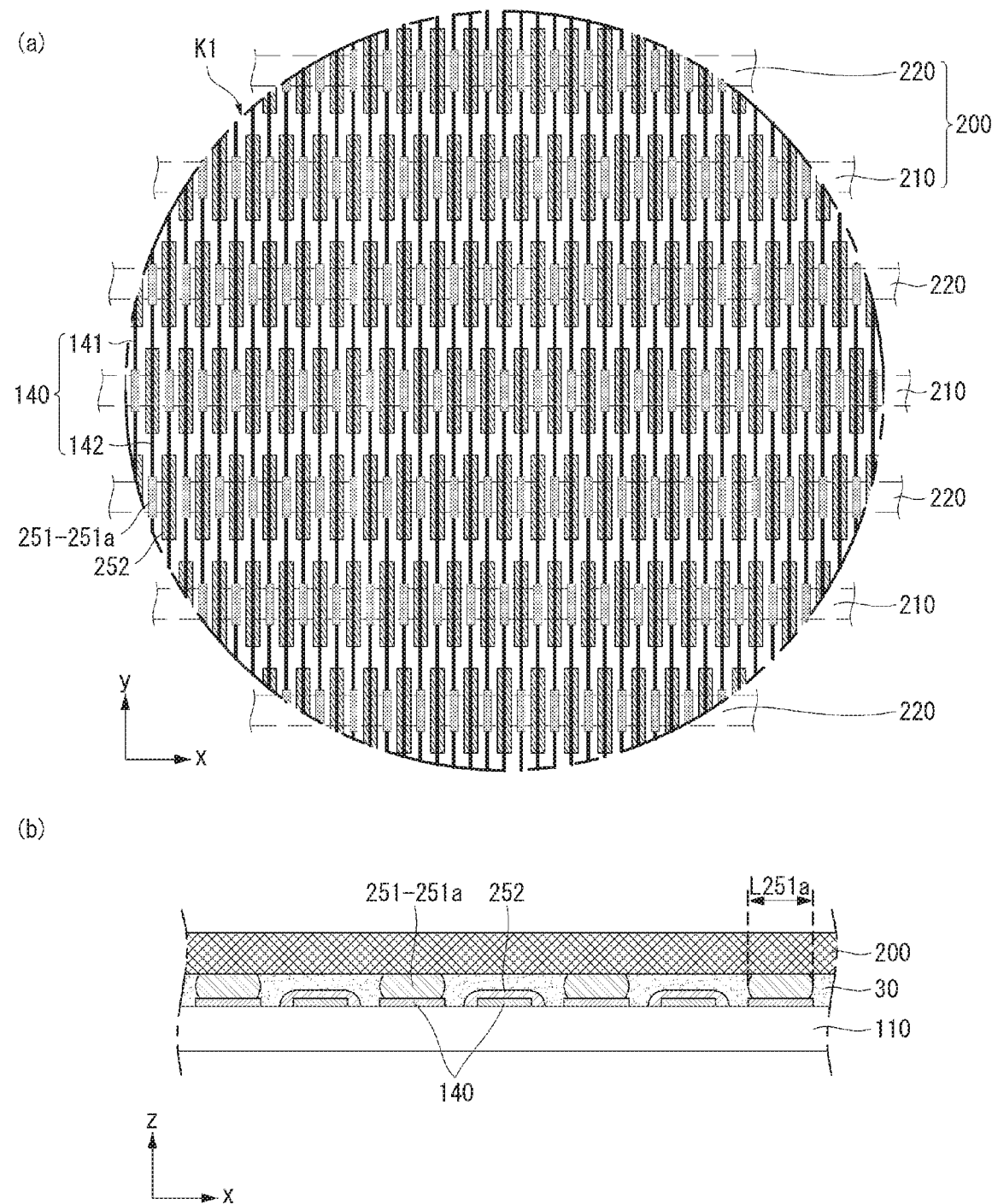

FIG. 17 illustrates a second example of a plane pattern of a first conductive adhesive 251 positioned in a middle portion A1 of a semiconductor substrate 110 shown in FIG. 14.

Figure 18:
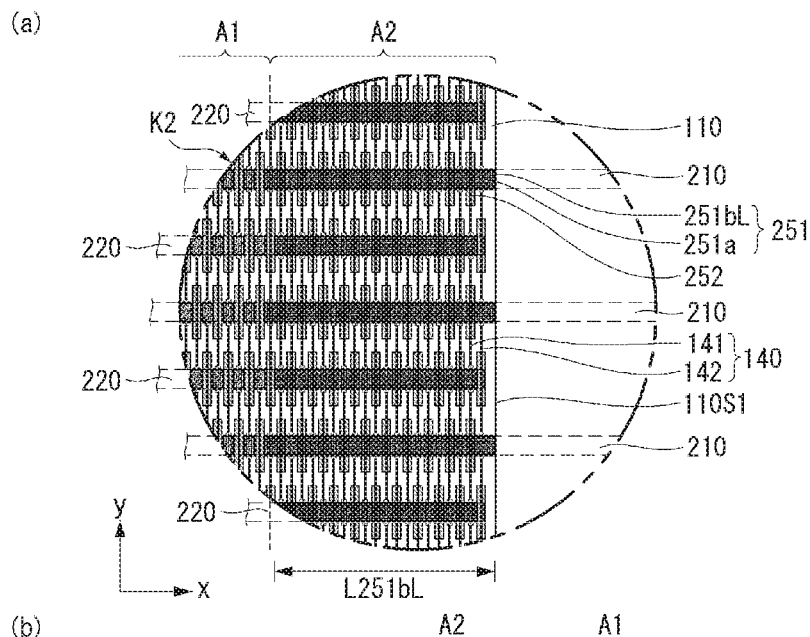
Figure 18:
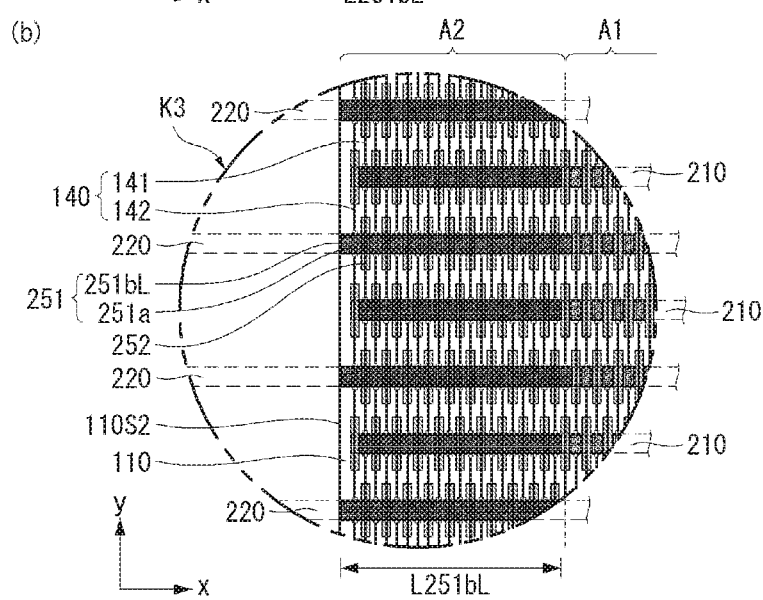
Figure 18:
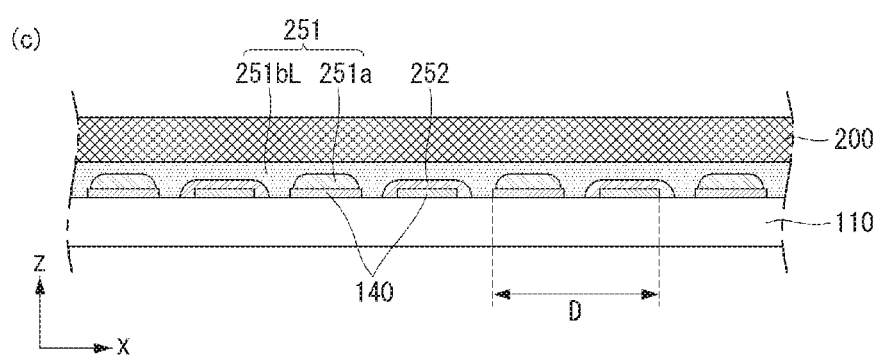

FIG. 18 enlargedly illustrates areas K2 and K3 in order to describe both the edge portions A2 of a semiconductor substrate 110 shown in FIG. 14.

More specifically, (a) of FIG. 18 is a plan view of an area K2 of a first edge portion A2 adjacent to a first side 110S1 of a semiconductor substrate 110, and (b) of FIG. 18 is a plan view of an area K3 of a second edge portion A2 adjacent to a second side 110S2 of a semiconductor substrate 110.

Further, (c) of FIG. 18 is a cross-sectional view of areas K2 and K3 in a second direction x in order to describe a cross-sectional structure of a first conductive adhesive 251 in the areas K2 and K3.

Figure 19:
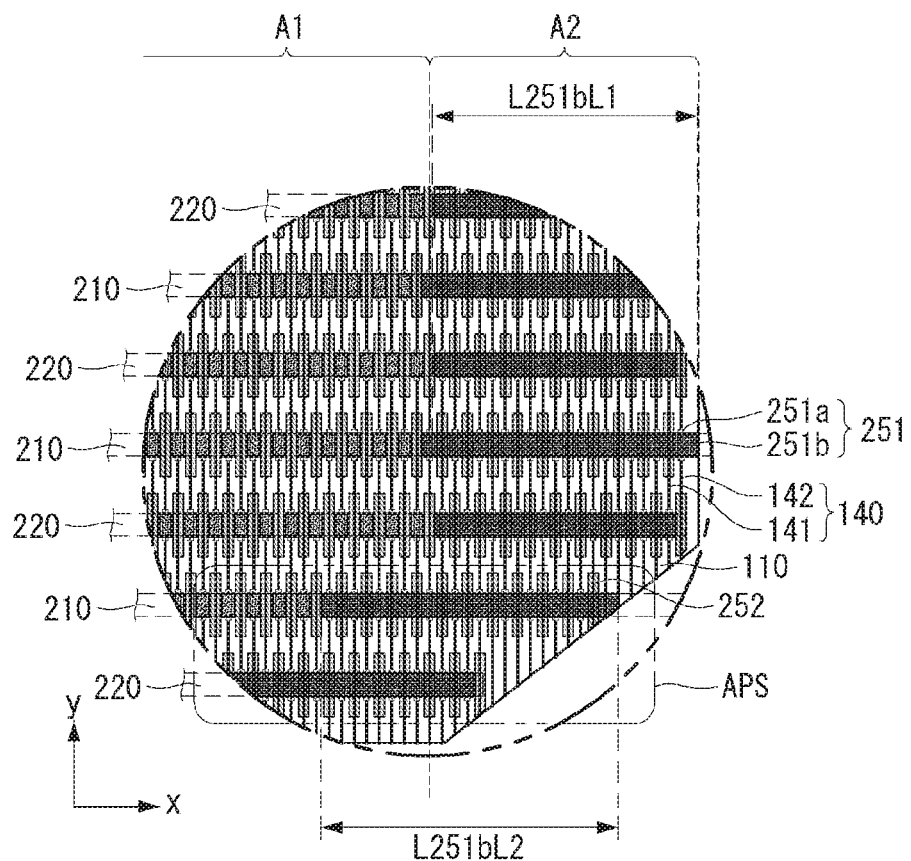

FIG. 19 enlargedly illustrates an area K4 in order to describe a pseudo area in an edge portion A2 of a semiconductor substrate 110.

Figure 20:
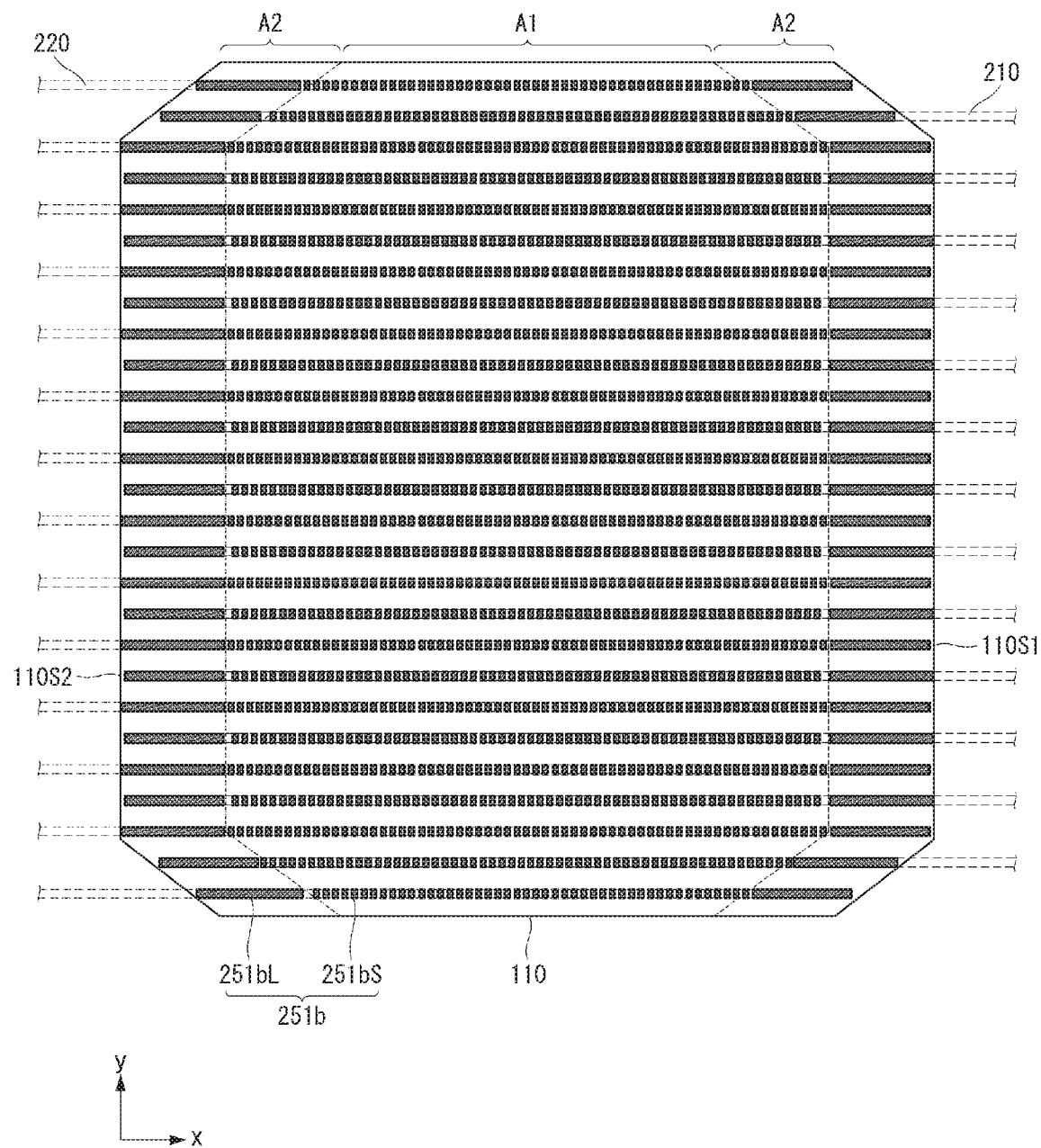

FIG. 20 illustrates a first example of a plane pattern of a second adhesive layer 251b positioned on a back surface of a semiconductor substrate 110.

Figure 21:
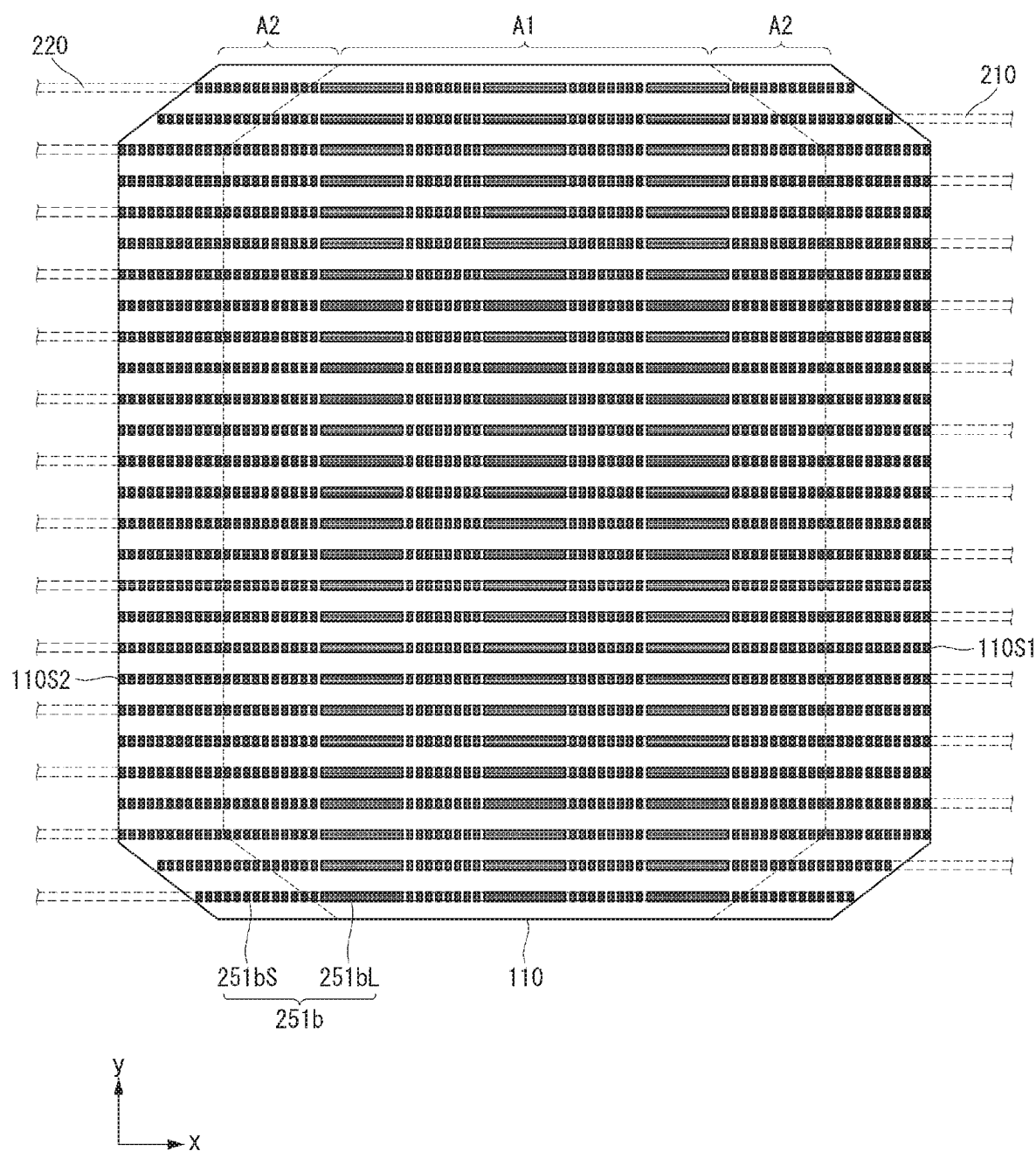
Figure 22:
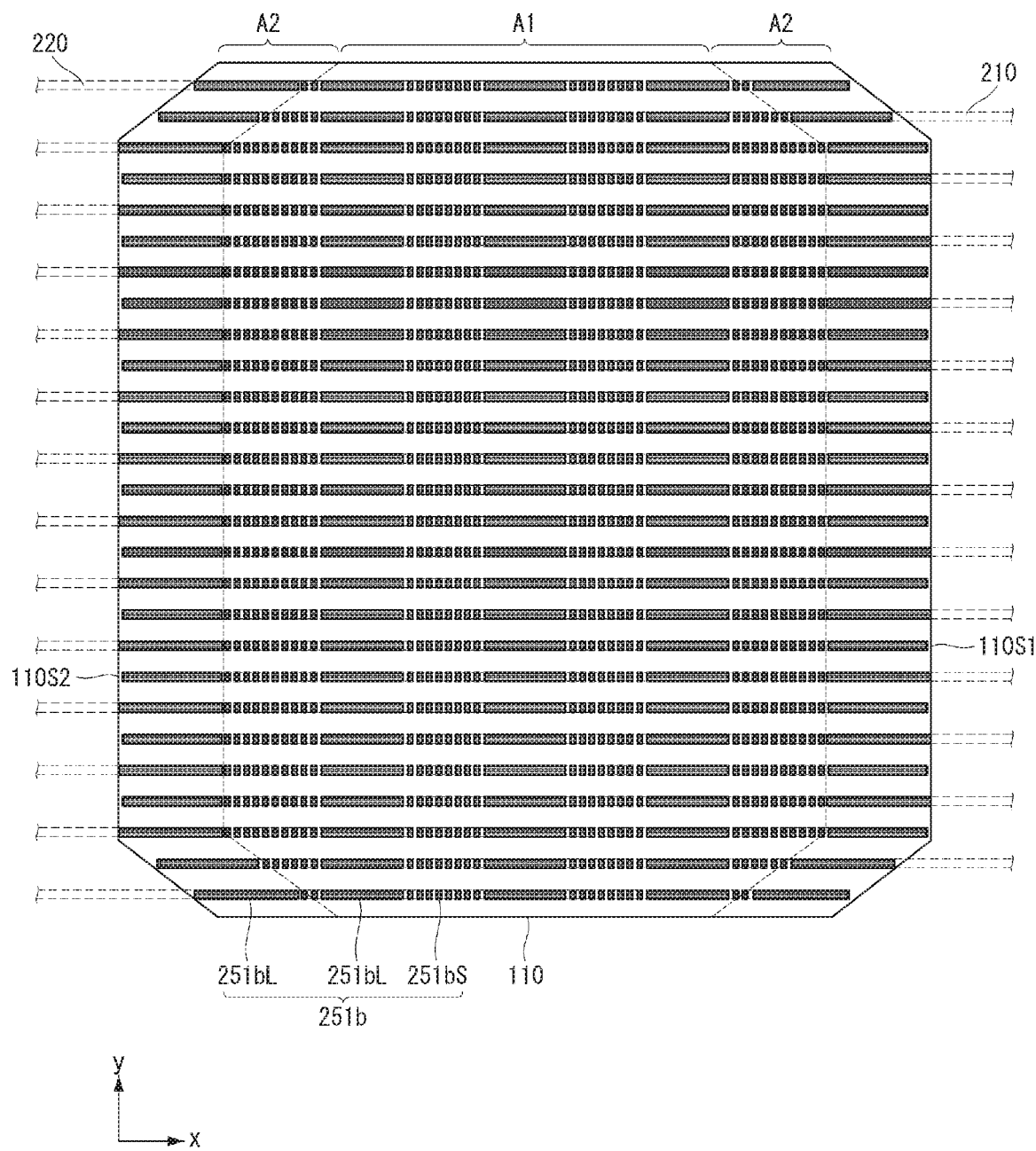

FIG. 21 illustrates a second example of a plane pattern of a second adhesive layer 251b positioned on a back surface of a semiconductor substrate 110. FIG. 22 illustrates a third example of a plane pattern of a second adhesive layer 251b positioned on a back surface of a semiconductor substrate 110.

FIGS. 20 to 22 show only a plane pattern of a second adhesive layer 251b positioned on a back surface of a semiconductor substrate 110 and first and second conductive lines, and other components are omitted in FIGS. 20 to 22.

In the following description, when the first conductive adhesive 251 includes the first adhesive layer 251a and the second adhesive layer 251b, a second direction length of the first conductive adhesive 251 may be substantially the same as a second direction length of the second adhesive layer 251b because the second direction length of the second adhesive layer 251b is longer than a second direction length of the first adhesive layer 251a.

Further, when at least a portion of the first conductive adhesive 251 includes only the first adhesive layer 251a, a second direction length of the at least a portion of the first conductive adhesive 251 may be substantially the same as a second direction length of the first adhesive layer 251a.

As shown in FIG. 14, a back surface of a semiconductor substrate 110 included in each of a plurality of solar cells may include a middle portion A1 and an edge portion A2.

The edge portions A2 of the back surface of the semiconductor substrate 110 are respectively positioned at both edges of the middle portion A1 in the second direction x.

Namely, as shown in FIG. 14, the edge portions A2 may be positioned on both sides of the middle portion A1 in the second direction x corresponding to a longitudinal direction of the first and second conductive lines 200 and may be positioned adjacent to first and second sides 110S1 and 110S2 of the semiconductor substrate 110.

FIG. 14 shows the edge portions A2 using a straight dotted line at both edges of the semiconductor substrate 110 in the second direction x. However, the straight dotted line is merely an example used to conceptually explain the middle portion A1 and the edge portions A2. The embodiment of the invention is not limited thereto.

A plurality of crossings, at which the plurality of first and second electrodes 140 and the plurality of first and second conductive lines 200 cross and overlap each other, may be disposed in the middle portion A1 and the edge portions A2 of the back surface of the semiconductor substrate 110.

As shown in FIGS. 4 and 5, a first conductive adhesive 251 may be positioned at the plurality of crossings, in order to perform electrical connection between the first electrodes 141 and the first conductive lines 210 and electrical connection between the second electrodes 142 and the second conductive lines 210.

A length (hereinafter, referred to as "second direction length") in the second direction x of at least a portion of the first conductive adhesive 251 positioned in the first area A1 of the back surface of the semiconductor substrate 110 may be different from a second direction length of at least a portion of the first conductive adhesive 251 positioned in the second area A2.

For example, a second direction length L251bL of at least a portion of the first conductive adhesive 251 positioned in the edge portion A2 may be longer than a second direction length L251bS of at least a portion of the first conductive adhesive 251 positioned in the middle portion A1.

More specifically, as shown in FIGS. 15 and 16, the first conductive adhesive 251 positioned in the middle portion A1 of the semiconductor substrate 110 may be positioned at each of the plurality of crossings and spaced apart.

Namely, as shown in (a) and (b) of FIG. 15, the first conductive adhesive 251 in the middle portion A1 of the semiconductor substrate 110 may be positioned at each of a plurality of crossings between the first conductive lines 210 and the first electrodes 141 and at each of a plurality of crossings between the second conductive lines 220 and the second electrodes 142.

Further, the first conductive adhesives 251 positioned at the plurality of crossings may be spaced apart from one another in the second direction x.

Namely, the first conductive adhesives 251 may be spaced between the plurality of crossings between the first conductive lines 210 and the first electrodes 141 and may be spaced between the plurality of crossings between the second conductive lines 220 and the second electrodes 142.

Further, an insulating layer 252 may be positioned at each of a plurality of crossings between the first conductive lines 210 and the second electrodes 142 and at each of a plurality of crossings between the second conductive lines 220 and the first electrodes 141.

The insulating layers 252 positioned at the crossings may be spaced apart from one another in the second direction x. The insulating layer 252 may insulate between the first conductive line 210 and the second electrode 142 and between the second conductive line 220 and the first electrode 141.

A thickness of the insulating layer 252 covering the electrode 140 may be less than a distance between the electrode 140 and the conductive line 200.

Hence, as shown in (b) of FIG. 15, an encapsulant 30 may be positioned in a space between the insulating layer 252 and the conductive line 200.

As shown in FIGS. 15 and 16, a second direction length L251bS of the first conductive adhesive 251 positioned in the middle portion A1 of the semiconductor substrate 110 may be greater than a linewidth of the electrode 140, or may be equal to or less than the linewidth of the electrode 140.

Even if the second direction length L251bS of the first conductive adhesive 251 positioned in the middle portion A1 is greater than the line width of the electrode 140, the second direction length L251bS may be within a range that does not generate a short circuit between the adjacent electrodes 140.

More specifically, the second direction length L251bS of the first conductive adhesive 251 positioned in the middle portion A1 may be 0.8 to 2 times the linewidth of the electrode 140.

For example, when a linewidth W140 of each of the first and second electrodes 141 and 142 is 0.3 mm to 0.5 mm and a distance between the first and second electrodes 141 and 142 is 0.3 mm to 0.6 mm, the second direction length L251bS of the first conductive adhesive 251 positioned in the middle portion A1 may be 0.2 mm to 1 mm.

The first conductive adhesive 251 in each of the first and second edge portions A2 of the semiconductor substrate 110 may be positioned at least two crossings of a plurality of crossings and the first and may be successively extended along the second direction x corresponding to the longitudinal direction of the first and second conductive lines 200.

More specifically, as shown in (a) and (b) of FIG. 18, the first conductive adhesive 251 positioned in each of the first and second edge portions A2 respectively adjacent to the first and second sides 110S1 and 110S2 of the semiconductor substrate 110 may overlap at least two adjacent crossings of a plurality of crossings and may be successively extended along the second direction x.

In the embodiment disclosed herein, the at least two crossings indicate a crossing between the first electrode 141 and one of the first and second conductive lines 200 and a crossing between the second electrode 142 and the one conductive line 200 that are successively positioned along the one conductive line 200 in the second direction x.

For example, the first conductive adhesive 251 in the edge portion A2 may overlap at least two crossings between the first and second electrodes 141 and 142 and the first conductive line 210, that are successively positioned along the first conductive line 210 in the second direction x, and may be successively extended along the second direction x.

In both the edge portions A2 of the semiconductor substrate 110, the insulation between the first conductive line 210 and the second electrode 142 and the insulation between the second conductive line 220 and the first electrode 141 may be performed by the insulating layer 252.

A second direction length L251bL of the first conductive adhesive 251 in the edge portion A2 of the semiconductor substrate 110 may be greater than a distance D between both ends of two adjacent crossings in the second direction x and may be within 10% of a maximum second direction length 110Lx of the semiconductor substrate 110.

As shown in (c) of FIG. 18, when two crossings between the first and second electrodes 141 and 142 and the conductive line 200 are successively positioned along the conductive line 200 in the second direction x, a distance D between both ends of the two crossings, that are adjacent to each other in the second direction x, indicates a maximum distance from an end of the crossing between the first electrode 141 and the conductive line 200 to an end of the crossing between the second electrode 142 and the conductive line 200.

For example, when the maximum second direction length 110Lx of the semiconductor substrate 110 is 156 mm, a linewidth of each of the first and second electrodes 141 and 142 is 0.3 mm to 0.5 mm, and a distance between the first and second electrodes 141 and 142 is 0.3 mm to 0.6 mm, the second direction length L251bL of the first conductive adhesive 251 in the edge portion A2 of the semiconductor substrate 110 may be, for example, 1.2 mm to 15.6 mm.

More preferably, the second direction length L251bL of the first conductive adhesive 251 in the edge portion A2 of the semiconductor substrate 110 may be 5 mm to 13 mm.

The first conductive adhesive 251 in the edge portion A2 of the semiconductor substrate 110 may overlap 2 to 15 crossings among crossings arranged in the second direction x and may be successively extended in the second direction x.

As shown in (c) of FIG. 18, the insulating layer 252 may be disposed at each of a plurality of crossings between the first conductive lines 210 and the second electrodes 142 and at each of a plurality of crossings between the second conductive lines 220 and the first electrodes 141 and may be spaced apart. In this instance, a thickness of the insulating layer 252 may be less than a distance between the electrode 140 and the conductive line 200.

Thus, as shown in (c) of FIG. 18, when the first conductive adhesive 251 in the edge portion A2 is extended in the second direction x as described above, the first conductive adhesive 251 may overlap the insulating layer 252 adjacent to the first conductive adhesive 251 in the second direction x.

Thus, as shown in (c) of FIG. 18, the first conductive adhesive 251, that is positioned in the edge portion A2 and extended in the second direction x, the first conductive adhesive 251 may be positioned in a space between the insulating layer 252 and the conductive line 200.

The embodiment of the invention causes the second direction length L251bL of the first conductive adhesive 251 in each edge portion A2 to be longer than the second direction length L251bS of the first conductive adhesive 251 in the middle portion A1, thereby further increasing a physical adhesive strength between the first and second conductive lines 200 and the first and second electrodes 140 in both the edge portions A2 of the semiconductor substrate 110 and further improving a contact resistance.

Hence, the embodiment of the invention can surely prevent the disconnection of the first and second conductive lines 200 in both the edge portions A2.

At least one of the first conductive adhesive 251 positioned in the first and second areas A1 and A2 of the semiconductor substrate 110 may include a first adhesive layer 251a and a second adhesive layer 251b each having a different melting point.

A structure of the first conductive adhesive 251 is described in detail below.

As shown in FIGS. 15, 16, and 18, the first conductive adhesive 251 may include a first adhesive layer 251a and a second adhesive layer 251b in the middle portion A1 and the two edge portions A2 of the back surface of the semiconductor substrate 110.

The second adhesive layer 251b may have a short pattern 251bS and a long pattern 251bL as described above with reference to FIGS. 9 to 11.

As shown in (b) of FIG. 15 and (c) of FIG. 18, the first adhesive layer 251a may be positioned between the first and second electrodes 141 and 142 and the first and second conductive lines 210 and 220 and may contact the first and second electrodes 141 and 142.

The second adhesive layer 251b may be positioned between the first and second conductive lines 210 and 220 and the first adhesive layer 251a. Namely, the second adhesive layer 251b may be positioned on the first adhesive layer 251a and may contact the first and second conductive lines 210 and 220.

Thus, a sum of thicknesses of the first and second adhesive layers 251a and 251b on the electrode 140 may be equal to a distance between the electrode 140 and the conductive line 200. A thickness of the insulating layer 252 on the electrode 140 may be less than the sum of the thicknesses of the first and second adhesive layers 251a and 251b.

A melting point of the second adhesive layer 251b may lower than a melting point of the first adhesive layer 251a.

As the first conductive adhesive 251 is configured such that the second adhesive layer 251b directly contacts the conductive line 200, a temperature of a thermal process for connecting the conductive lines 200 to the back surface of the semiconductor substrate 110 can be relatively reduced. Hence, a thermal expansion coefficient of the conductive line 200 can be further reduced.

The second adhesive layer 251b may have a different pattern structure in the middle portion A1 and the edge portion A2 of the semiconductor substrate 110.

For example, in the entire back surface of the semiconductor substrate 110 shown in FIG. 14, the second adhesive layer 251b in the edge portion A2 may be formed in the long pattern 251bL, and the second adhesive layer 251b in the middle portion A1 may be formed in the short pattern 251bS.

Thus, a second direction length L251bL of each of the second adhesive layers 251b, that are respectively positioned in both the edge portions A2 of the semiconductor substrate 110 and are formed in the long pattern 251bL, may be longer than a second direction length L251bS of the second adhesive layers 251b, that is positioned in the middle portion A1 and is formed in the short pattern 251bS.

Namely, as shown in (a) and (b) of FIG. 15, the second adhesive layer 251b in the middle portion A1 of the semiconductor substrate 110 may be positioned at each of a plurality of crossings overlapping the first and second conductive lines 210 and 220 and may be formed in the short pattern 251bS spaced in the second direction x.

As shown in FIG. 18, the second adhesive layer 251b in the edge portion A2 of the semiconductor substrate 110 may overlap a plurality of crossings and thus may be formed in the long pattern 251bL, that is successively extended along the second direction x corresponding to the longitudinal direction of the first and second conductive lines 210 and 220.

More specifically, as shown in FIGS. 15 and 16, the first and second adhesive layers 251a and 251b in the middle portion A1 of the semiconductor substrate 110 may be positioned at each of a plurality of crossings between the first and second electrodes 141 and 142 and the first and second conductive lines 210 and 220 and may be spaced apart.

As shown in (b) of FIG. 15, the first adhesive layer 251a may be disposed next above the electrode 140 and connected to the electrode 140. The second adhesive layer 251b formed in the short pattern 251bS may be formed to cover the first adhesive layer 251a. The conductive line 200 may be directly connected to the second adhesive layer 251b formed in the short pattern 251bS.

As shown in FIG. 16, a second direction length L251a of the first adhesive layer 251a may be less than a linewidth W140 of the electrode 140.

Further, a second direction length L251bS of the second adhesive layer 251b formed in the short pattern 251bS in the middle portion A1 of the semiconductor substrate 110 may be greater than the second direction length L251a of the first adhesive layer 251a in the middle portion A1 of the semiconductor substrate 110 and may be less than a distance between the two adjacent insulating layers 252 positioned on both sides of the first conductive adhesive 251.

A first direction width W251a of the first adhesive layer 251a may be greater than a linewidth W200 of the conductive line 200 and may be less than a first direction width W252 of the insulating layer 252. Also shown is the second direction length L252 of the insulating layer 252.

A first direction width W251bS of the second adhesive layer 251b formed in the short pattern 251bS may be less than the linewidth W200 of the conductive line 200, and more specifically, may be more than 0.8 times the linewidth W200 of the conductive line 200.

Hence, the second adhesive layer 251b formed in the short pattern 251bS in the middle portion A1 of the semiconductor substrate 110 is disposed to be spaced at a plurality of crossings and can improve a physical adhesive strength and a contact resistance between the conductive line and the electrode by maximizing the second direction length L251bS of the second adhesive layer 251b.

FIGS. 15 and 16 illustrate that the first conductive adhesive 251 in the middle portion A1 of the back surface of the semiconductor substrate 110 includes the first adhesive layer 251a and the second adhesive layer 251b, by way of example. However, the embodiment of the invention is not limited thereto.

For example, as shown in (a) and (b) of FIG. 17, the first conductive adhesive 251 in the middle portion A1 of the back surface of the semiconductor substrate 110 may include only the first adhesive layer 251a except the second adhesive layer 251b formed in the short pattern 251bS.

When the first conductive adhesive 251 includes only the first adhesive layer 251a as shown in FIG. 17, the second direction length L251a and the first direction width W251a of the first adhesive layer 251a except a thickness of the first adhesive layer 251a may be substantially the same as those illustrated in FIG. 16.

As shown in FIG. 17, because the first conductive adhesive 251 electrically connects the electrode 140 to the conductive line 200 using only the first adhesive layer 251a, the thickness of the first adhesive layer 251a may be greater than a thickness of the insulating layer 252 and may be substantially equal to a distance between the electrode 140 and the conductive line 200.

Since remaining portions of the first conductive adhesive 251 shown in FIG. 17 are substantially the same as those of FIGS. 15 and 16, a further description may be briefly made or may be entirely omitted.

As shown in (a) to (c) of FIG. 18, the second adhesive layer 251b formed in the long pattern 251bL in the edge portion A2 of the semiconductor substrate 110 may overlap at least two crossings of a plurality of crossings and may be successively extended along the second direction x corresponding to the longitudinal direction of the first and second conductive lines 200.

More specifically, as shown in (c) of FIG. 18, the second adhesive layer 251b, that is positioned between one conductive line 200 and the first adhesive layer 251a and is formed in the long pattern 251bL, may be extended up to between the one conductive line 200 and the insulating layer 252 along the second direction x.

Thus, the second adhesive layer 251b formed in the long pattern 251bL may overlap the first adhesive layer 251a and the insulating layer 252.

A second direction length L251bL of the second adhesive layer 251b formed in the long pattern 251bL in the edge portion A2 of the semiconductor substrate 110 may be longer than a second direction length L251a of the first adhesive layer 251a in the middle portion A1 and the edge portion A2 of the semiconductor substrate 110.

More specifically, the second direction length L251bL of the second adhesive layer 251b formed in the long pattern 251bL may be greater than a distance D between both ends of two crossings, that are adjacent to each other in the second direction x, and may be within 10% of a maximum second direction length 110Lx of the semiconductor substrate 110.

Thus, each second adhesive layer 251b formed in the long pattern 251bL may overlap the first adhesive layers 251a that are spaced apart from one another in the second direction x.

A thickness of the second adhesive layer 251b formed in the long pattern 251bL in the edge portion A2 of the semiconductor substrate 110 may be less than a thickness of the first adhesive layer 251a in the edge portion A2 of the semiconductor substrate 110.

Namely, as shown in (c) of FIG. 18, a thickness of the first adhesive layer 251a positioned at a crossing between the conductive line 200 and the electrode 140 may be greater than a thickness of the second adhesive layer 251b that is positioned between the first adhesive layer 251a and the conductive line 200 and is formed in the long pattern 251bL.

A linewidth of the second adhesive layer 251b formed in the long pattern 251bL may be substantially equal to a linewidth of the second adhesive layer 251b formed in the short pattern 251bS.

A second direction length L251a of the first adhesive layer 251a in the middle portion A1 of the semiconductor substrate 110 may be substantially equal to a second direction length L251a of the first adhesive layer 251a in the edge portion A2 of the semiconductor substrate 110.

When the first adhesive layer 251a is configured as shown in FIG. 17, a thickness of the first adhesive layer 251a in the middle portion A1 of the semiconductor substrate 110 may be greater than a thickness of the first adhesive layer 251a in the edge portion A2 of the semiconductor substrate 110.

When the first adhesive layer 251a is configured as shown in FIGS. 15 and 16, a thickness of the first adhesive layer 251a in the middle portion A1 of the semiconductor substrate 110 may be substantially equal to a thickness of the first adhesive layer 251a in the edge portion A2 of the semiconductor substrate 110.

As shown in (a) of FIG. 18, in the first edge portion A2 adjacent to the first side 110S1 of the semiconductor substrate 110, the first conductive line 210 may protrude to the outside of a projection area of the semiconductor substrate 110, and an end of the second conductive line 220 may be positioned inside the projection area of the semiconductor substrate 110.

As shown in (a) of FIG. 18, in the first edge portion A2 adjacent to the first side 110S1 of the semiconductor substrate 110, an end in the second direction x of the long pattern 251bL overlapping the first conductive line 210 in the second adhesive layer 251b formed in the long pattern 251bL may be positioned closer to the first side 110S1 of the semiconductor substrate 110 than an end in the second direction x of the long pattern 251bL overlapping the second conductive line 220.

As shown in (b) of FIG. 18, in the second edge portion A2 adjacent to the second side 110S2 of the semiconductor substrate 110, the second conductive line 220 may protrude to the outside of a projection area of the semiconductor substrate 110, and an end of the first conductive line 210 may be positioned inside the projection area of the semiconductor substrate 110.

As shown in (b) of FIG. 18, in the second edge portion A2 adjacent to the second side 110S2 of the semiconductor substrate 110, an end in the second direction x of the long pattern 251bL overlapping the second conductive line 220 may be positioned closer to the second side 110S2 of the semiconductor substrate 110 than an end in the second direction x of the long pattern 251bL overlapping the first conductive line 210.

Hence, the first and second conductive lines 200 protruding to the outside of the projection area of the semiconductor substrate 110 in both the edge portions A2 of the semiconductor substrate 110 may be physically attached securely to the semiconductor substrate 110.

A melting point of the second adhesive layer 251b may be lower than a melting point of the first adhesive layer 251a.

The melting point of the first adhesive layer 251a may be higher than a first temperature between 160° C. and 170° C. and may be equal to or lower than 300° C. The melting point of the second adhesive layer 251b may be equal to or higher than 110° C. and may be lower than the first temperature.

Referring to FIG. 19 enlargedly illustrating the area K4 of FIG. 14, a second direction length L251bL2 of the first conductive adhesive 251 positioned in a pseudo area APS, that is at a corner of the edge portion A2 of the semiconductor substrate 110, may be longer than a second direction length L251bS of the first conductive adhesive 251 in the middle portion A1 of the semiconductor substrate 110.

The first conductive adhesive 251 in the pseudo area APS of the semiconductor substrate 110 may include a first adhesive layer 251a and a second adhesive layer 251b as described above with reference to FIG. 18.

The second direction length L251bL2 of the first conductive adhesive 251 in the pseudo area APS of the semiconductor substrate 110 may be equal to or shorter than a second direction length L251bL1 of the first conductive adhesive 251 positioned in the edge portion A2 except the pseudo area APS.

When the second direction lengths L251bL1 and L251bL2 of the first conductive adhesive 251 in the edge portion A2 are greater than the second direction length L251bS of the first conductive adhesive 251 in the middle portion A1, a shear stress and a plastic strain of a portion of the conductive line 200 connected to the edge portion A2 of the semiconductor substrate 110 can be greatly reduced. Hence, the disconnection of the conductive lines 200 can be prevented and minimized.

So far, the embodiment of the invention described an example where the second direction length of at least a portion of the first conductive adhesive 251 in the first area A1 is different from the second direction length of at least a portion of the first conductive adhesive 251 in the second area A2, with reference to FIGS. 15 to 20.

Namely, the first conductive adhesive 251 may include the first adhesive layer 251a and the second adhesive layer 251b, the first adhesive layer 251a may be spaced between the crossings in the middle portion A1 and the edge portion A2, and the second adhesive layer 251b may have the short pattern 251bS in the middle portion A1 and have the long pattern 251bL in the edge portion A2 as shown in FIG. 20.

Thus, the second direction length L251bL of the second adhesive layer 251b having the long pattern 251bL in the edge portion A2 may be longer than the second direction length L251bS of the second adhesive layer 251b having the short pattern 251bS in the middle portion A1.

Hence, the second direction length L251bL of the first conductive adhesive 251 in the edge portion A2 may be longer than the second direction length L251bS of the first conductive adhesive 251 in the middle portion A1. However, the embodiment of the invention is not limited thereto.

For example, as shown in FIG. 21, a second adhesive layer 251b in the edge portion A2 may be formed in a short pattern 251bS, and a second adhesive layer 251b in the middle portion A1 may be formed by a combination of the short pattern 251bS and a long pattern 251bL.

Further, a second adhesive layer 251b shown in FIG. 22 may be formed by a combination of the second adhesive layer 251b shown in FIG. 20 and the second adhesive layer 251b shown in FIG. 21.

Namely, the second adhesive layer 251b in the middle portion A1 may be formed by a combination of the short pattern 251bS and the long pattern 251bL, and the second adhesive layer 251b in the edge portion A2 may be formed in the long pattern 251bL.

Further, the embodiment of the invention described that when the second direction length of at least a portion of the first conductive adhesive 251 in the first area A1 is different from the second direction length of at least a portion of the first conductive adhesive 251 in the second area A2, the first conductive adhesive 251 includes the first adhesive layer 251a and the second adhesive layer 251b, and the second adhesive layer 251b has a different length in the first area A1 and the second area A2.

However, even when the first conductive adhesive 251 includes only the first adhesive layer 251a except the second adhesive layer 251b, the configuration illustrated in FIGS. 15 to 22 may be equally applied to it.

Figure 23:
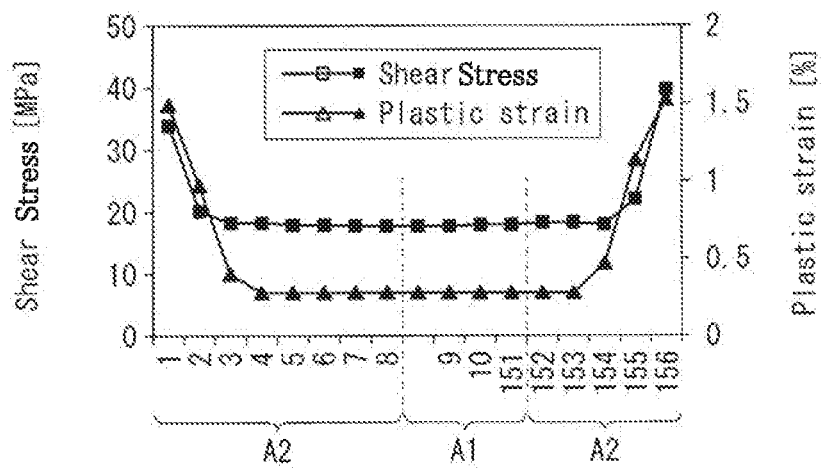
FIG. 23 is a figure illustrating an effect of an embodiment of the invention.
Figure 23:
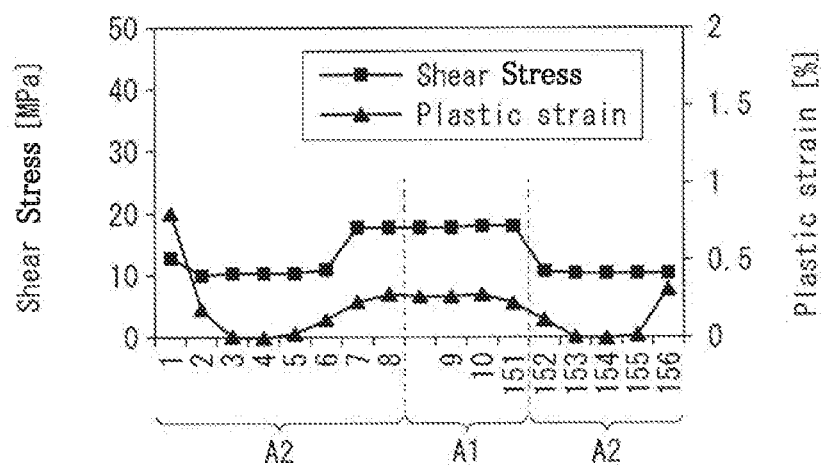

FIG. 23 is a figure illustrating an effect of an embodiment of the invention.

More specifically, (a) of FIG. 23 illustrates a shear stress and a plastic strain of the first and second conductive lines 200 when the first conductive adhesive 251 in the middle portion A1 and the edge portion A2 of the semiconductor substrate 110 is positioned at each of a plurality of crossings arranged in the second direction x and is spaced apart.

Further, (b) of FIG. 23 illustrates a shear stress and a plastic strain of the first and second conductive lines 200 when the first conductive adhesive 251 in the edge portion A2 of the semiconductor substrate 110 overlaps at least two crossings, that are successively arranged in the second direction x, and is extended as shown in FIGS. 14 to 19.

In the embodiment disclosed herein, the shear stress of the first and second conductive lines 200 indicates a thermal expansion stress of the second direction x applied to the first and second conductive lines 200 in a state where the first and second conductive lines 200 are connected to the back surface of the semiconductor substrate 110 through a thermal process, such as the lamination process.

Further, the plastic strain of the first and second conductive lines 200 indicates a strain degree of the first and second conductive lines 200 resulting from the thermal expansion stress during the thermal process, such as the lamination process.

In (a) and (b) of FIG. 23, number on the x-axis indicates an identification number of each of the plurality of crossings overlapping the first and second conductive lines 200.

For example, (b) of FIG. 23 illustrates a shear stress and a plastic strain of the first and second conductive lines 200 when the first conductive adhesive 251 in both the edge portions A2 of the semiconductor substrate 110 overlaps at least five crossings, that are successively arranged in the second direction x, and is extended.

As indicated by the graph of (a) of FIG. 23, a shear stress and a plastic strain applied to the first and second conductive lines 200 in both the edge portions A2 of the semiconductor substrate 110 was much greater than a shear stress and a plastic strain applied to the first and second conductive lines 200 in the middle portion A1 of the semiconductor substrate 110.

However, as indicated by the graph of (b) of FIG. 23, when the second direction length of the first conductive adhesive 251 in both the edge portions A2 of the semiconductor substrate 110 was longer than the second direction length of the first conductive adhesive 251 in the middle portion A1 of the semiconductor substrate 110, a shear stress and a plastic strain applied to the first and second conductive lines 200 in both the edge portions A2 was less than a shear stress and a plastic strain applied to the first and second conductive lines 200 in the middle portion A1.

As described above, the embodiment of the invention can reduce the shear stress and the plastic strain applied to the first and second conductive lines 200 in both the edge portions A2 of the semiconductor substrate 110 by causing the second direction length of the first conductive adhesive 251 in the edge portion A2 to be longer than the second direction length of the first conductive adhesive 251 in the middle portion A1, thereby preventing the disconnection of the first and second conductive lines 200.

In order to sufficiently secure a reduction in the shear stress and the plastic strain applied to the first and second conductive lines 200 in both the edge portions A2 of the semiconductor substrate 110 and minimize the manufacturing cost of the first conductive adhesive 251, the second direction length of the first conductive adhesive 251 in the edge portion A2 may vary depending on whether or not an end of each of the first and second conductive lines 200 protrudes to the outside of the side of the semiconductor substrate 110.

This is described in detail below.

Figure 24:
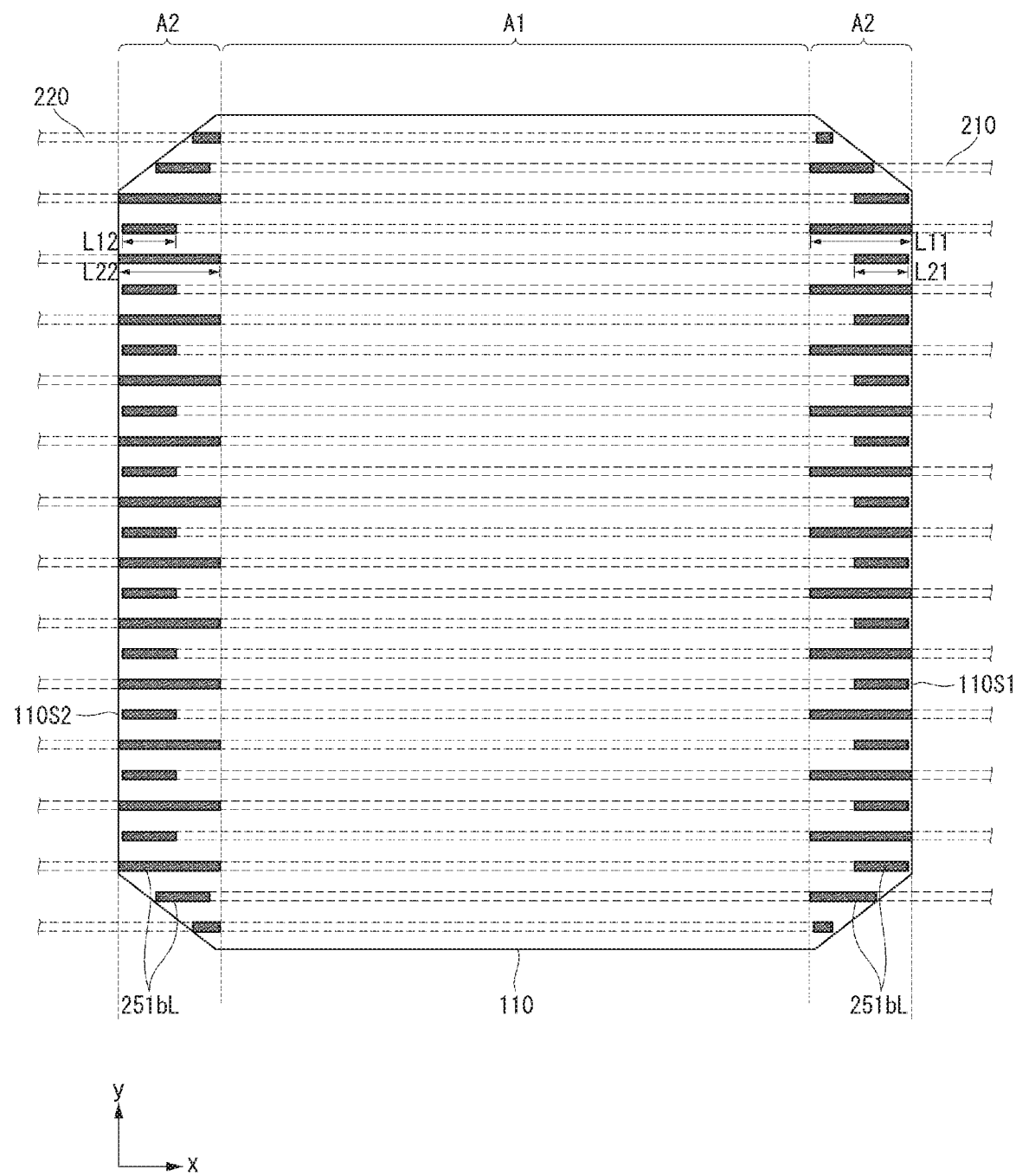
FIG. 24 illustrates a modified example of a first conductive adhesive positioned in both edge portions of a semiconductor substrate.

FIG. 24 illustrates a modified example of a first conductive adhesive positioned in both edge portions of a semiconductor substrate.

In FIG. 24, the configuration of the middle portion A1 of the semiconductor substrate 110 is not illustrated, and remaining components except the first and second conductive lines 200 and the second adhesive layer 251b of the first conductive adhesive 251 in both the edge portions A2 of the semiconductor substrate 110 are not illustrated for the sake of brevity and ease of reading.

As shown in FIG. 24, one end of the first conductive line 210 may protrude to the outside of the first side 110S1 of the semiconductor substrate 110, and the other end may be positioned inside the second edge portion A2. Further, one end of the second conductive line 220 may protrude to the outside of the second side 110S2 opposite the first side 110S1 of the semiconductor substrate 110, and the other end may be positioned inside the first edge portion A2.

When the conductive line 200 protrudes from the edge portion A2 to the outside of the side of the semiconductor substrate 110, a length of the conductive line 200 may relatively increase. Hence, a thermal expansion length of the conductive line 200 may relatively increase, and a thermal expansion stress of the conductive line 200 may relatively increase.

Thus, a length of the first conductive adhesive 251 overlapping the conductive line 200 protruding from the edge portion A2 to the outside of the side of the semiconductor substrate 110 may relatively increase.

On the other hand, a length of the first conductive adhesive 251 overlapping the conductive line 200, which does not protrude to the outside of the side of the semiconductor substrate 110 and of which an end is positioned inside the edge portion A2, may relatively decrease.

More specifically, in the first edge portion A2 except the pseudo area APS, a second direction length L11 of the long pattern 251bL overlapping the first conductive line 210 may be longer than a second direction length L21 of the long pattern 251bL overlapping the second conductive line 220.

Further, the second direction length L11 of the long pattern 251bL overlapping the first conductive line 210 in the first edge portion A2 except the pseudo area APS may be longer than a second direction length L12 of the long pattern 251bL overlapping the first conductive line 210 in the second edge portion A2.

In the second edge portion A2 except the pseudo area APS, a second direction length L22 of the long pattern 251bL overlapping the second conductive line 220 may be longer than the second direction length L12 of the long pattern 251bL overlapping the first conductive line 210.

Further, the second direction length L22 of the long pattern 251bL overlapping the second conductive line 220 in the second edge portion A2 except the pseudo area APS may be longer than the second direction length L21 of the long pattern 251bL overlapping the second conductive line 220 in the first edge portion A2.

Hence, the embodiment of the invention can further improve a connection resistance and a physical adhesive strength of the first and second conductive lines 200 while minimizing the use of the first conductive adhesive 251.

The embodiment of the invention described an example of relatively increasing the length of the first conductive adhesive 251 in the edge portion A2 in order to further improve the connection resistance and the physical adhesive strength of the first and second conductive lines 200.

Hereinafter, an example of further improving the connection resistance and the physical adhesive strength of the first and second conductive lines 200 by changing a pattern of the first and second electrodes 140 in the edge portion A2 is described.

Figure 25:
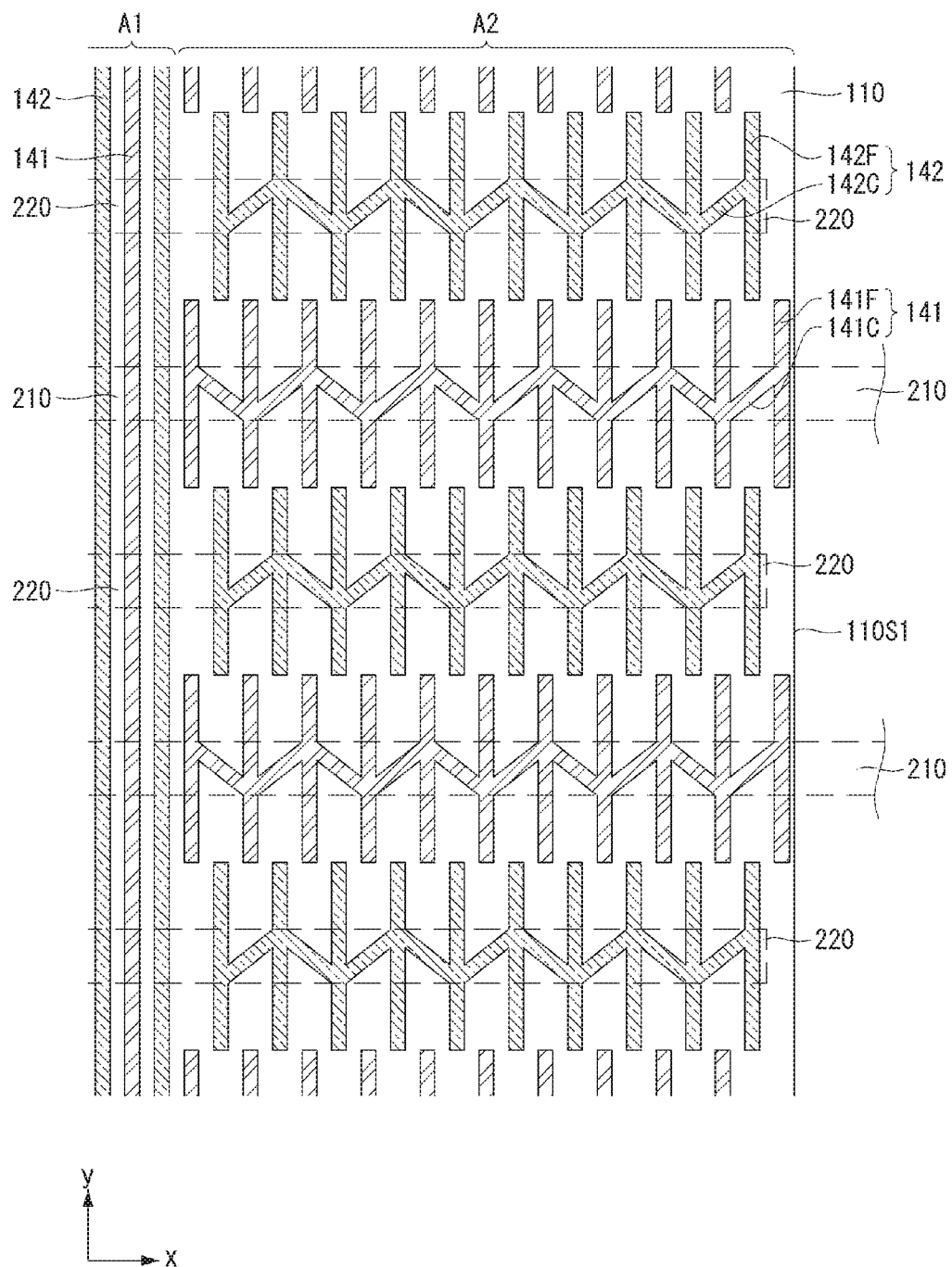
FIGS. 25 to 27 illustrate various modified examples of a pattern of first and second electrodes in an edge portion of a semiconductor substrate.
Figure 26:
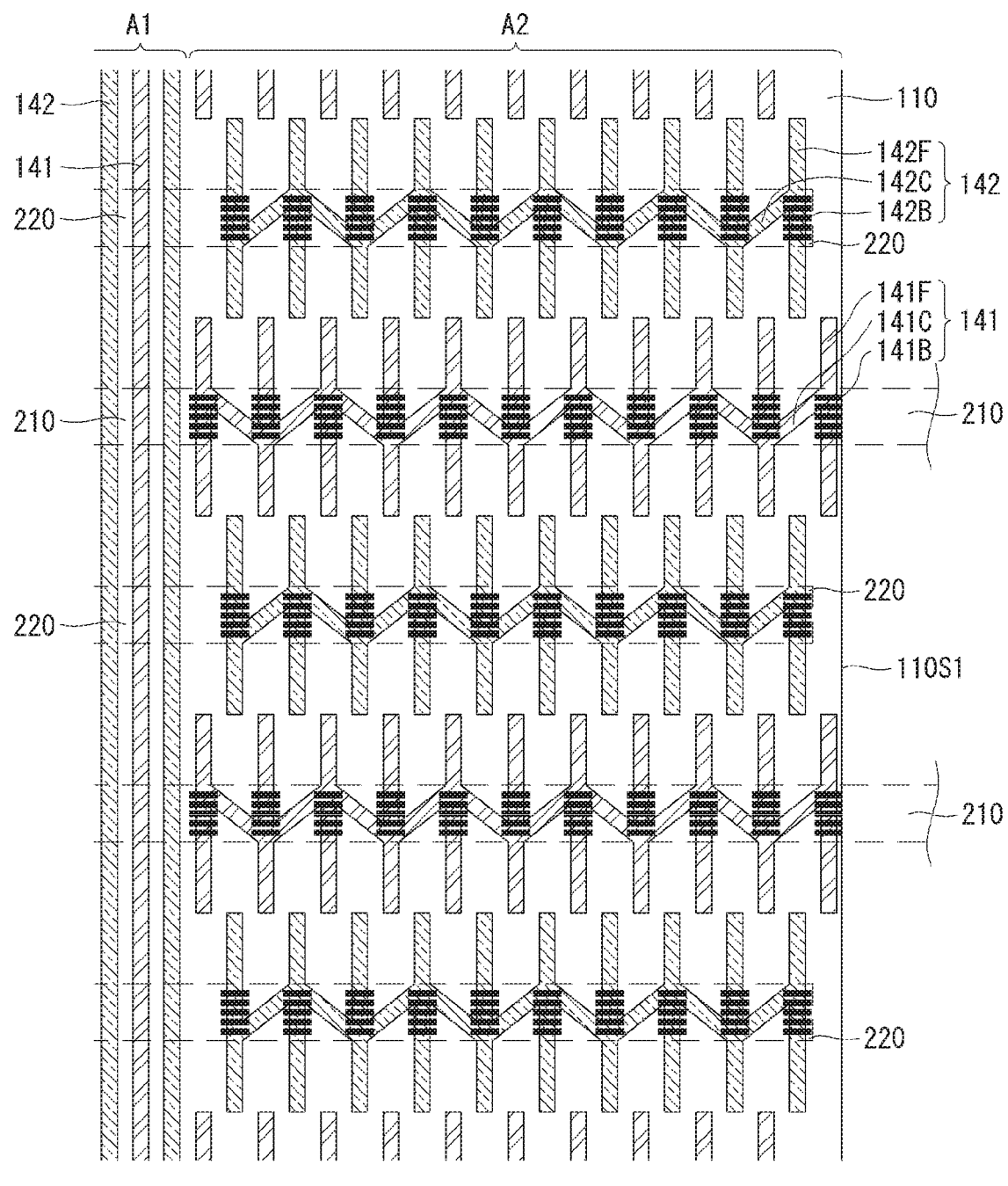

FIGS. 25 and 26 illustrate various modified examples of a pattern of first and second electrodes in an edge portion of a semiconductor substrate in order to further improve a connection resistance and a physical adhesive strength of first and second conductive lines.

As shown in FIG. 25, the first and second electrodes 141 and 142 in the middle portion A1 of the semiconductor substrate 110 may be extended in the first direction y and may be spaced apart from each other in the second direction x.

However, in both the edge portions A2 of the semiconductor substrate 110, the plurality of first electrodes 141 may include a plurality of first finger electrodes 141F and a first connection electrode 141C, and the plurality of second electrodes 142 may include a plurality of second finger electrodes 142F and a second connection electrode 142C.

The plurality of first finger electrodes 141F may be extended in the first direction y and may be disconnected in a portion in which the second conductive line 220 is positioned. The first connection electrode 141C may be positioned inside an overlap portion between the first conductive line 210 and the first finger electrodes 141F and may connect the plurality of first finger electrodes 141F in the second direction x.

Further, the plurality of second finger electrodes 142F may be extended in the first direction y and may be disconnected in a portion in which the first conductive line 210 is positioned. The second connection electrode 142C may be positioned inside an overlap portion between the second conductive line 220 and the second finger electrodes 142F and may connect the plurality of second finger electrodes 142F in the second direction x.

Each of the first and second connection electrodes 141C and 142C may be formed in a zigzag shape in an area of the first and second edge portions A2 overlapping the first and second conductive lines 200.

As shown in FIG. 25, the first and second electrodes 141 and 142 may be configured such that they include the plurality of first and second finger electrodes 141F and 142F and the first and second connection electrodes 141C and 142C in the edge portion A2 of the semiconductor substrate 110, and the first and second finger electrodes 141F and 142F overlap the conductive line or are not connected to the conductive line in order to prevent the short circuit between the first and second electrodes 141 and 142 and the conductive line. Hence, the insulating layer 252 shown in (c) of FIG. 18 may not be used in the edge portion A2, and only the first conductive adhesive 251 may be used.

Hence, the embodiment of the invention further increases a connection area between the first conductive line 210 and the first electrode 141 and a connection area between the second conductive line 220 and the second electrode 142 in the edge portion A2 of the semiconductor substrate 110, thereby further improving a physical adhesive strength of the first and second conductive lines in the edge portion A2.

As shown in FIG. 26, in both the edge portions A2 of the semiconductor substrate 110, the first electrode 141 may further include a first branch electrode 141B protruding from the first finger electrode 141F in the second direction x in an overlap portion between the first conductive line 210 and the first electrode 141, and the second electrode 142 may further include a second branch electrode 142B protruding from the second finger electrode 142F in the second direction x in an overlap portion between the second conductive line 220 and the second electrode 142.

Hence, the embodiment of the invention can further improve the connection resistance and the physical adhesive strength between the first conductive line 210 and the first electrode 141 and between the second conductive line 220 and the second electrode 142 in both the edge portions A2 of the semiconductor substrate 110.

So far, the structure of the solar cell module according to the embodiment of the invention was mainly described. Hereinafter, an example of a method for manufacturing the solar cell module according to the embodiment of the invention is described briefly.

Figure 27:
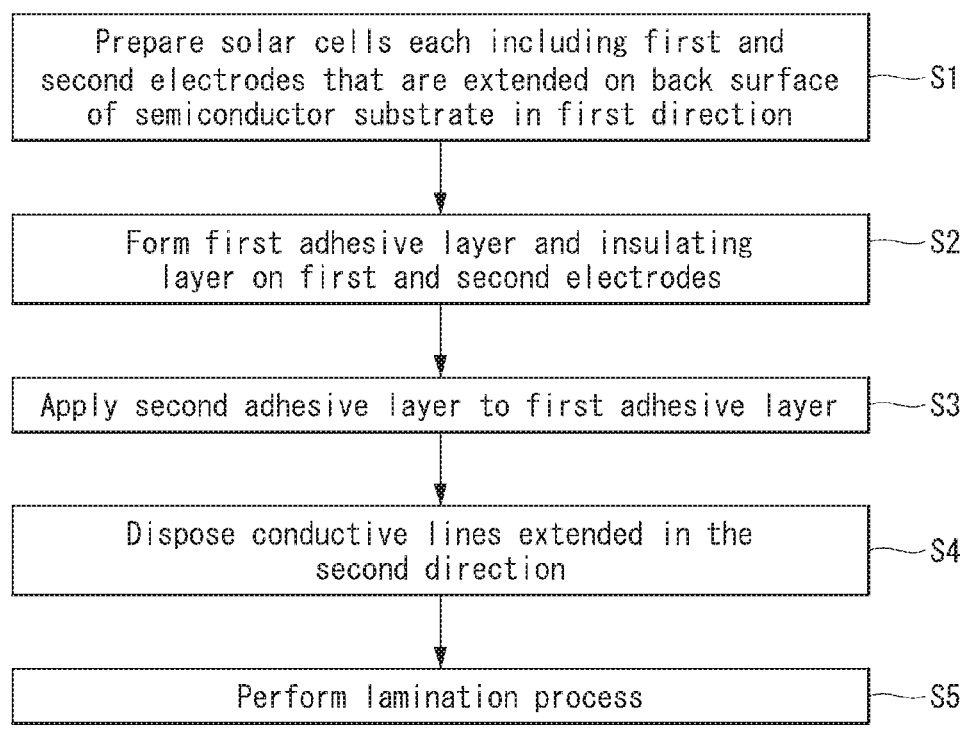

As shown in FIG. 27, a method for manufacturing a solar cell module according to the embodiment of the invention may include an operation S1 of preparing a plurality of solar cells, an operation S2 of forming a first adhesive layer and an insulating layer, an operation S3 of applying a second adhesive layer, an operation S4 of disposing conductive lines, and an operation S5 of performing a lamination process.

The operation S1 of preparing the plurality of solar cells may include preparing the plurality of solar cells each including first and second electrodes 141 and 142, that each have a different polarity and are extended on a back surface of a semiconductor substrate 110 in the first direction y.

The operation S2 of forming a first adhesive layer 251a and an insulating layer 252 may include forming the first adhesive layer 251a on one of the first and second electrodes 141 and 142 and forming the insulating layer 252 on the other electrode as shown in FIG. 10.

In the operation S2, the first adhesive layer 251a and the insulating layer 252 on the electrodes 141 and 142 may be in a dried and cured state.

The operation S3 of applying a second adhesive layer 251b may include applying the second adhesive layer 251b, of which a melting point is lower than a melting point of the first adhesive layer 251a, to the first adhesive layer 251a and drying the second adhesive layer 251b.

In the operation S3 of applying the second adhesive layer 251b, the second adhesive layer 251b may be applied in a short pattern 251bS or a long pattern 251bL as indicated by the case 1, the case 2, and the case 3.

For example, the second adhesive layer 251b may be formed in the long pattern 251bL, in which a second direction length of at least a portion of the second adhesive layer 251b positioned in an edge portion A2 of the semiconductor substrate 110 is longer than a second direction length of the first adhesive layer 251a.

In the edge portion A2 of the semiconductor substrate 110, a second direction length or a location of the long pattern 251bL overlapping a first conductive line 210 may be different from a second direction length or a location of the long pattern 251bL overlapping a second conductive line 220.

Namely, as shown in FIG. 18, in the edge portion A2, a location of an end of the long pattern 251bL overlapping the first conductive line 210 adjacent to a first side 110S1 or a second side 110S2 of the semiconductor substrate 110 may be different from a location of an end of the long pattern 251bL overlapping the second conductive line 220 adjacent to the first side 110S1 or the second side 110S2.

Alternatively, as shown in FIG. 24, in the edge portion A2 of the semiconductor substrate 110, a second direction length of the long pattern 251bL overlapping the first conductive line 210 may be different from the second direction length of the long pattern 251bL overlapping the second conductive line 220.

The operation S4 of disposing conductive lines 200 may include disposing the conductive lines 200 in the second direction x crossing the first direction y so that the conductive lines 200 overlap the first and second adhesive layers 251a and 251b and the insulating layer 252.

After the operation S4 of disposing the conductive lines 200, the plurality of solar cells, to which the conductive lines 200 are attached, may be arranged in the second direction x, and then first conductive lines 210 of a first solar cell C1 of two adjacent solar cells and second conductive lines 220 of a second solar cell C2 may be commonly connected to an interconnector 300.

Hence, the first solar cell C1 and the second solar cell C2 may be connected in series to each other in the second direction x by the interconnector 300.

In this instance, the conductive lines 200 have not yet been electrically connected to the first and second electrodes 141 and 142 on the semiconductor substrate 110.

Next, the operation S5 of performing the lamination process may include performing the lamination process involving heat and pressure in a state where the plurality of solar cells are disposed between a front transparent substrate 10 and a back sheet 40 to attach the second adhesive layer 251b to the conductive line 200.

More specifically, the lamination process may be performed in a state where a sheet type encapsulant 20 is disposed on the front transparent substrate 10, the plurality of solar cells, in which the conductive lines 200 are disposed on a back surface of each solar cell, are disposed on the encapsulant 20, and a sheet type encapsulant 30 and the back sheet 40 are subsequently disposed on the back surfaces of the solar cells, on which the conductive lines 200 are disposed.

A temperature of the lamination process may be higher than the melting point of the second adhesive layer 251b and may be lower than the melting point of the first adhesive layer 251a.

Hence, in the lamination process, only the second adhesive layer 251b may melt and may be physically and electrically connected to the first adhesive layer 251a and the conductive lines 200.

Thus, the embodiment of the invention can minimize the thermal expansion of the conductive lines 200 and greatly reduce a defect rate of the solar cell module because only the second adhesive layer 251b melts in the lamination process and is attached to the conductive lines 200.

Although embodiments have been described with reference to a number of illustrative embodiments thereof, it should be understood that numerous other modifications and embodiments can be devised by those skilled in the art that will fall within the scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
   a plurality of solar cells each including a semiconductor substrate and first and second electrodes, each of which has a different polarity and is extended in a first direction on a back surface of the semiconductor substrate;
   a first conductive line extended in a second direction crossing the first direction on the back surface of the semiconductor substrate, and connected to the first electrodes through a conductive adhesive and insulated from the second electrodes by an insulating layer;
   a second conductive line extended in the second direction and spaced apart from the first conductive line in the first direction on the back surface of the semiconductor substrate, and connected to the second electrodes through the conductive adhesive and insulated from the first electrodes by the insulating layer;
   a front transparent substrate on the plurality of solar cells;
   a back substrate under the plurality of solar cells; and
   an encapsulant between the front transparent substrate and the plurality of solar cells and between the back substrate and the plurality of solar cells,
   wherein the conductive adhesive includes:
      a first adhesive layer having a first melting point higher than a lamination temperature of the encapsulant, and directly contacting the first electrodes at each of a plurality of crossings between the first conductive line and the first electrodes and directly contacting the second electrodes at each of a plurality of crossings between the second conductive line and the second electrodes; and
      a second adhesive layer having a second melting point lower than the first melting point and equal to or less than the lamination temperature of the encapsulant, and directly contacting the first conductive line and the second conductive line, and
   wherein at least a portion of the second adhesive layer is formed in a long pattern, and is continuously formed in the second direction to electrically connect two adjacent first electrodes in the second direction.

2. The solar cell module of claim 1, wherein a thickness of the second adhesive layer is less than a thickness of the first adhesive layer.

3. The solar cell module of claim 1, wherein the first adhesive layer is made of a first epoxy solder paste, and the first epoxy solder paste includes at least one material of Sn, SnAgCu, SnPb, SnBiCuCo, SnBiAg, SnPbAg, and SnAg, and
   wherein the second adhesive layer is made of a second epoxy solder paste, and the second epoxy solder paste includes at least one material of SnBi and SnIn.

4. The solar cell module of claim 1, wherein the second adhesive layer is positioned on each first adhesive layer.

5. The solar cell module of claim 1, wherein the back surface of the semiconductor substrate included in each solar cell includes a middle portion and edge portions positioned at both edges of the middle portion in the second direction, and
   wherein the long pattern of the second adhesive layer is positioned in the edge portions, or the second adhesive layer is formed in the long pattern on the entire back surface of the semiconductor substrate.

6. The solar cell module of claim 5, wherein in the edge portions of the semiconductor substrate, a second direction length or a location of the long pattern overlapping the first conductive line is different from a second direction length or a location of the long pattern overlapping the second conductive line.

7. The solar cell module of claim 5, wherein the second adhesive layer of the long pattern overlaps the first adhesive layer and the insulating layer.

8. The solar cell module of claim 5, wherein in the edge portions of the semiconductor substrate, the second direction length of the second adhesive layer having the long pattern is greater than a distance between both ends of two crossings and is less than 10% of a maximum second direction length of the semiconductor substrate, and
   wherein the two crossings are points that one of the first and second conductive lines cross each of the first and second electrode that are adjacent to each other in the second direction.

9. The solar cell module of claim 5, wherein the edge portions of the semiconductor substrate include:
   a first edge portion adjacent to a first side of the semiconductor substrate, to which the first conductive line protrudes; and
   a second edge portion positioned opposite the first side and adjacent to a second side of the semiconductor substrate, to which the second conductive line protrudes.

10. The solar cell module of claim 9, wherein in the first edge portion of the semiconductor substrate, the second direction length of the long pattern overlapping the first conductive line is longer than the second direction length of the long pattern overlapping the second conductive line.

11. The solar cell module of claim 9, wherein the second direction length of the long pattern overlapping the first conductive line in the first edge portion is longer than the second direction length of the long pattern overlapping the first conductive line in the second edge portion.

12. The solar cell module of claim 9, wherein in the second edge portion of the semiconductor substrate, the second direction length of the long pattern overlapping the second conductive line is longer than the second direction length of the long pattern overlapping the first conductive line.

13. The solar cell module of claim 9, wherein the second direction length of the long pattern overlapping the second conductive line in the second edge portion is longer than the second direction length of the long pattern overlapping the second conductive line in the first edge portion.

14. The solar cell module of claim 5, wherein the first electrodes in both the edge portions of the semiconductor substrate include:
   a plurality of first finger electrodes, that are extended in the first direction and are disconnected in a portion in which the second conductive line is positioned; and
   a first connection electrode, that is positioned inside an overlap portion between the first conductive line and the first finger electrodes and connects the plurality of first finger electrodes in the second direction,
   wherein the second electrodes in both the edge portions of the semiconductor substrate include:

a plurality of second finger electrodes, that are extended in the first direction and are disconnected in a portion in which the first conductive line is positioned; and a second connection electrode, that is positioned inside an overlap portion between the second conductive line and the second finger electrodes and connects the plurality of second finger electrodes in the second direction.

15. The solar cell module of claim 14, wherein each of the first and second connection electrodes is formed in a zigzag shape in both the edge portions of the semiconductor substrate.

16. The solar cell module of claim 14, wherein the first electrodes in both the edge portions of the semiconductor substrate further include a first branch electrode protruding from the first finger electrode in the second direction in the overlap portion between the first conductive line and the first finger electrodes, and wherein the second electrodes in both the edge portions of the semiconductor substrate further include a second branch electrode protruding from the second finger electrode in the second direction in the overlap portion between the second conductive line and the second finger electrodes.

17. The solar cell module of claim 1, further comprising an interconnector disposed between a first solar cell and a second solar cell adjacent to the first solar cell among the plurality of solar cells, and extended in the first direction, wherein the first conductive line connected to the first solar cell and the second conductive line connected to the second solar cell are commonly connected to the interconnector, and the first and second solar cells are connected in series to each other in the second direction by the interconnector.

18. The solar cell module of claim 2, wherein the thickness of the second adhesive layer is a range of ¹⁄₁₀ to ½ of the thickness of the first adhesive layer.

19. The solar cell module of claim 2, wherein the thickness of the first adhesive layer is approximately 9 µm to 100 µm, and the thickness of the second adhesive layer is approximately 1 µm to 50 µm.

20. The solar cell module of claim 1, wherein the lamination temperature is between 160° C. to 170° C.

21. The solar cell module of claim 1, wherein each of the first and second conductive lines includes a core and a coating layer coating the core, wherein the insulating layer is separated from the coating layer by a predetermined distance, and wherein the thickness of the first adhesive layer between one of the first and second electrodes and one of the first and second conductive lines is greater than a thickness of the insulating layer between the other of the first and second electrodes and the one of the first and second conductive lines.

22. The solar cell module of claim 1, wherein a first direction width of the second adhesive layer is less than a first direction width of the first adhesive layer.

23. The solar cell module of claim 1, wherein a first direction width of the insulating layer is greater than both a first direction width of the second adhesive layer and a first direction width of the first adhesive layer.

24. The solar cell module of claim 1, wherein in an overlapping region of the second adhesive layer and the first adhesive layer, the second adhesive layer fully covers side surfaces in the second direction of the first adhesive layer.

* * * * *